US012575306B2

(12) United States Patent　　(10) Patent No.:　US 12,575,306 B2
Kim et al.　　　　　　　　　　　(45) Date of Patent:　　Mar. 10, 2026

(54) ORGANIC LIGHT EMITTING DISPLAY APPARATUS

(71) Applicant: LG Display Co., Ltd., Seoul (KR)

(72) Inventors: Dohyung Kim, Paju-si (KR); Saemleenuri Lee, Paju-si (KR); Seungwon Yoo, Paju-si (KR); Joonsuk Lee, Paju-si (KR); Seongwoo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 698 days.

(21) Appl. No.: 17/564,018

(22) Filed: Dec. 28, 2021

(65) Prior Publication Data

US 2022/0123069 A1　　Apr. 21, 2022

Related U.S. Application Data

(63) Continuation of application No. 16/709,654, filed on Dec. 10, 2019, now Pat. No. 11,244,987.

(30) Foreign Application Priority Data

Dec. 27, 2018　(KR) ........................ 10-2018-0170851

(51) Int. Cl.
H10K 59/88　　　(2023.01)
H10K 59/121　　(2023.01)
(Continued)

(52) U.S. Cl.
CPC ......... H10K 59/88 (2023.02); H10K 59/1213 (2023.02); H10K 59/124 (2023.02); (Continued)

(58) Field of Classification Search
CPC ............. H01L 27/3211; H01L 27/3213; H01L 27/3223; H01L 27/3244; H01L 27/3246; (Continued)

(56) References Cited

U.S. PATENT DOCUMENTS 8,357,938 B2　1/2013　Yoon et al.
9,129,923 B1　9/2015　Han et al.
(Continued)

FOREIGN PATENT DOCUMENTS

CN　　104659055 A　　5/2015
CN　　108172597 A　　6/2018
(Continued)

OTHER PUBLICATIONS

Korean Intellectual Property Office, Office Action, Korean Patent Application No. 10-2018-0170851, Feb. 12, 2024, 11 pages.
(Continued)

*Primary Examiner* — Mary A Wilczewski
(74) *Attorney, Agent, or Firm* — Fenwick & West LLP

(57)　　　　ABSTRACT

An organic light emitting display apparatus is disclosed, wherein the organic light emitting display apparatus comprises a driving thin film transistor provided on a substrate and disposed in a pixel area including a plurality of sub pixels; an organic light emitting diode electrically connected with the driving thin film transistor; and a repair portion provided at one side of the organic light emitting diode, wherein the organic light emitting diode is electrically connected with the driving thin film transistor through the repair portion.

14 Claims, 12 Drawing Sheets

(51) Int. Cl.

| | |
|---|---|
| *H10K 59/123* | (2023.01) |
| *H10K 59/124* | (2023.01) |
| *H10K 59/126* | (2023.01) |
| *H10K 59/131* | (2023.01) |
| *H10K 71/00* | (2023.01) |

(52) U.S. Cl.
CPC ....... *H10K 59/126* (2023.02); *H10K 59/1315* (2023.02); *H10K 59/123* (2023.02); *H10K 71/861* (2023.02)

(58) Field of Classification Search
CPC ............. H01L 27/3258; H01L 27/3262; H01L 27/3272; H01L 27/3279; H01L 51/52; H01L 51/56; H01L 2251/568; G02F 1/136259; H10K 59/88; H10K 59/1213; H10K 59/124; H10K 59/126; H10K 59/1315; H10K 71/861; H10K 59/122; H10K 59/123; H10K 59/8052
See application file for complete search history.

(56) References Cited

U.S. PATENT DOCUMENTS

| | | | |
|---|---|---|---|
| 9,147,723 | B1 | 9/2015 | Lee et al. |
| 9,391,292 | B2 | 7/2016 | Choi et al. |
| 9,502,487 | B2 | 11/2016 | Jeong et al. |
| 9,761,644 | B2 | 9/2017 | Jeong et al. |
| 9,911,799 | B2 | 3/2018 | Cho et al. |
| 10,147,769 | B2 | 12/2018 | Lee et al. |
| 10,339,845 | B2 | 7/2019 | Choi et al. |
| 10,446,613 | B2 | 10/2019 | Lee et al. |
| 10,971,058 | B1 | 4/2021 | Cheng et al. |
| 11,210,975 | B2 | 12/2021 | Choi et al. |
| 11,244,987 | B2 * | 2/2022 | Kim .................. H10K 59/1315 |
| 2006/0178072 | A1 | 8/2006 | Konda |
| 2007/0120476 | A1 | 5/2007 | Park et al. |
| 2007/0126006 | A1 | 6/2007 | Lin |
| 2012/0049215 | A1 | 3/2012 | Yoon et al. |
| 2012/0064641 | A1 | 3/2012 | Yang et al. |
| 2014/0110678 | A1 | 4/2014 | Jin et al. |
| 2014/0154818 | A1 * | 6/2014 | Shimamura ........... G01R 31/44 |
| | | | 438/4 |
| 2015/0144904 | A1 | 5/2015 | Hun et al. |
| 2015/0161943 | A1 | 6/2015 | Shim et al. |
| 2015/0280169 | A1 | 10/2015 | Choi et al. |
| 2016/0211314 | A1 | 7/2016 | Kim et al. |
| 2017/0033168 | A1 | 2/2017 | Jeong et al. |
| 2017/0092166 | A1 | 3/2017 | Choi et al. |
| 2018/0158878 | A1 | 6/2018 | Lee et al. |
| 2019/0027549 | A1 | 1/2019 | Ai et al. |
| 2019/0081111 | A1 | 3/2019 | Lee et al. |
| 2019/0355288 | A1 | 11/2019 | Choi et al. |
| 2020/0027944 | A1 | 1/2020 | Xuan et al. |
| 2020/0161593 | A1 | 5/2020 | Cheng |
| 2020/0212131 | A1 | 7/2020 | Kim et al. |
| 2021/0098551 | A1 | 4/2021 | Lee et al. |
| 2023/0209895 | A1 * | 6/2023 | Shim .................... H10K 59/131 |
| | | | 257/40 |
| 2023/0209914 | A1 * | 6/2023 | Shim ................ H10K 59/80515 |
| | | | 257/72 |

FOREIGN PATENT DOCUMENTS

| | | | |
|---|---|---|---|
| CN | 208111487 | U | 11/2018 |
| KR | 10-2007-0081825 | A | 8/2007 |
| KR | 10-2012-0019026 | A | 3/2012 |
| KR | 10-1429904 | B1 | 8/2014 |
| KR | 10-2015-0111544 | A | 10/2015 |
| KR | 10-2017-0038602 | A | 4/2017 |

OTHER PUBLICATIONS

Korean Intellectual Property Office, Office Action, Korean Patent Application No. 10-2018-0170851, Aug. 19, 2023, 18 pages.
China National Intellectual Property Administration, Office Action, CN Patent Application No., 201911242374.3, Jan. 28, 2023, nine pages.
United States Office Action, U.S. Appl. No. 16/709,654, May 24, 2021, 13 pages.

* cited by examiner

ORGANIC LIGHT EMITTING DISPLAY APPARATUS

CROSS-REFERENCE TO RELATED APPLICATION

This application is a continuation application of U.S. patent application Ser. No. 16/709,654 filed on Dec. 10, 2019, which claims the benefit of Republic of Korea Patent Application No. 10-2018-0170851, filed on Dec. 27, 2018, both of which are hereby incorporated by reference in their entirety.

BACKGROUND

Technical Field

The present disclosure relates to an organic light emitting display apparatus.

Discussion of the Related Art

With the advancement of an information-oriented society, a display apparatus for displaying information has been developed in various types. Recently, various display apparatuses such as a liquid crystal display (LCD) apparatus, a plasma display apparatus, and an organic light emitting display (OLED) apparatus have been utilized.

The organic light emitting display apparatus largely includes an array device and an organic light emitting device. The array device includes a switching thin film transistor connected with gate and data lines, and at least one driving thin film transistor connected with the organic light emitting device. The organic light emitting device includes an anode electrode, an organic light emitting layer and a cathode electrode which are connected with the driving thin film transistor.

However, the organic light emitting device having the above structure may have defects of abnormal driving caused by a deterioration of the thin film transistor properties and an internal short of the thin film transistor for a process of manufacturing lines and switching and driving thin film transistors.

If the thin film transistor formed in one pixel area is not driven normally, a current or voltage is not applied to the organic light emitting device connected with the thin film transistor, whereby it may cause dark spots therein. If there is a short between source and drain electrodes of the driving thin film transistor, the driving thin film transistor is not driven normally so that a voltage applied to the source electrode is directly applied to the drain electrode without being turned on/off. Thus, the pixel area to be driven is in a turning-on state, to thereby cause defects of bright spots.

Especially, the bright spots may be clearly visible to a user, to thereby deteriorate a picture quality. Thus, even though only one spot occurs in a front surface of a display area, it becomes a defective display device, whereby it cannot be used for a final product.

SUMMARY

The present disclosure has been made in view of the above problems, and it is an object of the present disclosure to provide an organic light emitting display apparatus which enables to carry out a repair treatment for a sub pixel having bright spots through a simplified structure, and minimizes or reduces problems related with damages of the sub pixel caused by the repair treatment and lowering of reliability.

It is another object of the present disclosure to provide an organic light emitting display apparatus including a sub pixel structure which facilitates a repair treatment.

It is another object of the present disclosure to provide a transparent organic light emitting display apparatus including a sub pixel structure which facilitates a repair treatment.

In addition to the objects of the present disclosure as mentioned above, additional objects of the present disclosure will be clearly understood by those skilled in the art from the following description of the present disclosure.

In accordance with an aspect of the present disclosure, the above and other objects can be accomplished by the provision of an organic light emitting display apparatus comprising a driving thin film transistor provided on a substrate and disposed in a pixel area including a plurality of sub pixels; an organic light emitting device electrically connected with the driving thin film transistor; and a repair portion provided at one side of the organic light emitting device, wherein the organic light emitting device is electrically connected with the driving thin film transistor through the repair portion.

According to one or more embodiments of the present disclosure, the sub pixel having bright spots in the organic light emitting display apparatus may be darkened by the repair treatment, to thereby improve the yield.

According to one or more embodiments of the present disclosure, it is possible to improve an efficiency of the repair treatment in the organic light emitting display apparatus, and to minimize or reduce problems related with damages of the sub pixel caused by the repair treatment and lowering of reliability.

In addition to the effects of the present disclosure as mentioned above, additional objects of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings.

FIG. 8D is a cross sectional view of a cutting line which is cut along a first anode electrode, a repair portion and a driving thin film transistor of FIG. 7A.

DETAILED DESCRIPTION OF THE DISCLOSURE

Figure 1:
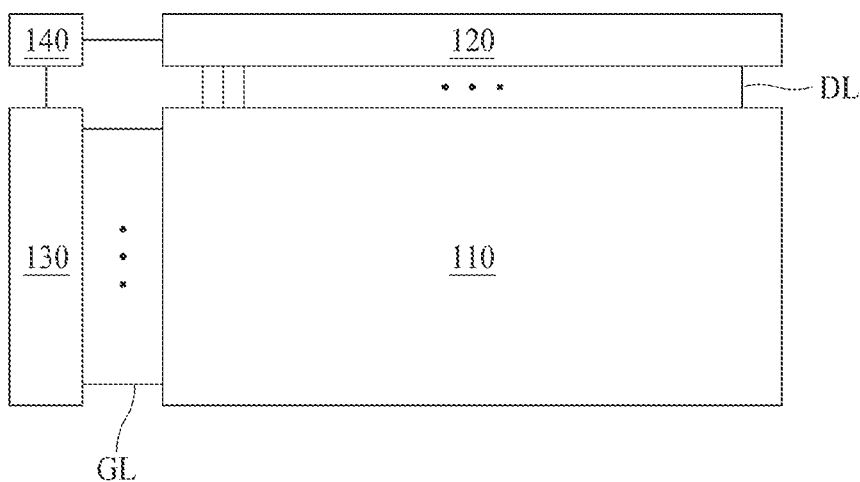
FIG. 1 is a schematic system structure of an organic light emitting display apparatus according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where "comprise", "have", and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when the position relationship is described as "upon~", "above~", "below~", and "next to~", one or more portions may be arranged between two other portions unless "just" or "direct" is used.

In describing a time relationship, for example, when the temporal order is described as "after~", "subsequent~", "next~", and "before~", a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an organic light emitting display apparatus according to the present disclosure will be described in detail with reference to the accompanying drawings. In the drawings, the same or similar elements are denoted by the same reference numerals even though they are depicted in different drawings.

FIG. 1 is a schematic system structure of an organic light emitting display apparatus 100 according to the present disclosure.

Referring to FIG. 1, the organic light emitting display apparatus 100 according to the present disclosure may include a display panel 110 provided with a plurality of data lines (DL), a plurality of gate lines (GL) and a plurality of pixels, a data driver 120 configured to drive the data line (DL) by outputting a data voltage to the plurality of data lines (DL), a gate driver 130 configured to drive the gate line (GL) by sequentially outputting a scan signal to the plurality of gate lines (GL), and a timing controller 140 configured to control the data driver 120 and the gate driver 130 by outputting various control signals.

The aforementioned data driver 120 may include a plurality of data driving integrated circuits. The plurality of data driving integrated circuits may be directly formed on the display panel 110, or may be connected with a bonding pad of the display panel 110 by a tape automated bonding (TAB) method or a chip on glass (COG) method. If needed, the data driver 120 may be integrated with the display panel 110.

According to a driving method, as shown in FIG. 1, the aforementioned gate driver 130 may be positioned at one side of the display panel 110, or may be divided into two, and then positioned at both sides of the display panel 110. Also, the gate driver 130 may include a plurality of gate driving integrated circuits, wherein the plurality of gate driving integrated circuits may be connected with the bonding pad of the display panel 110 by a tape automated bonding (TAB) method or a chip on glass (COG) method, or may be formed in a gate in panel (GIP) type and may be directly formed on the display panel 110. If needed, the gate driver 130 may be integrated with the display panel 110.

Figure 2:
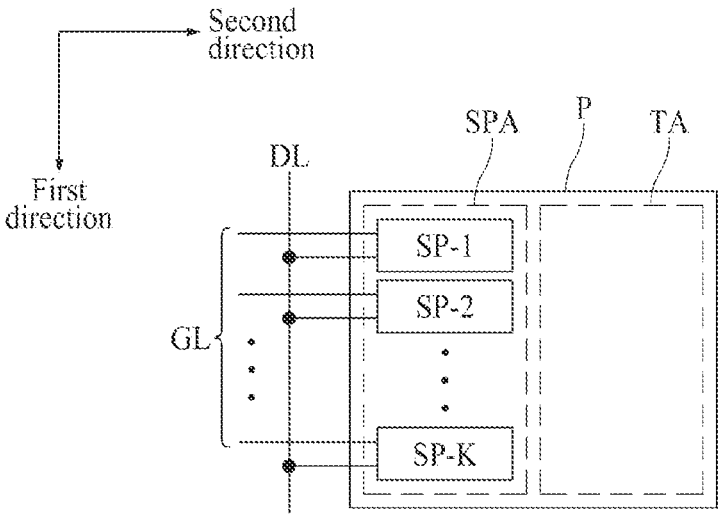
FIG. 2 illustrates an arrangement structure of a transmission area and a sub pixel in a pixel according to one embodiment of the present disclosure.

FIG. 2 illustrates an arrangement structure of a transmission area and a sub pixel in a pixel according to one embodiment of the present disclosure.

Referring to FIG. 2, one pixel (P) may include a sub pixel area (SPA) provided with "k" sub pixels (SP: sub pixel, SP_1, SP_2, . . . , SP_k) configured to express different colors, and a transmission area (TA). Herein, "k" indicates the number of sub pixels included in pixel (P), and "k" may be 3 or 4. If needed, "k" may be 2, 5 or an natural number above 5.

Figure 3:
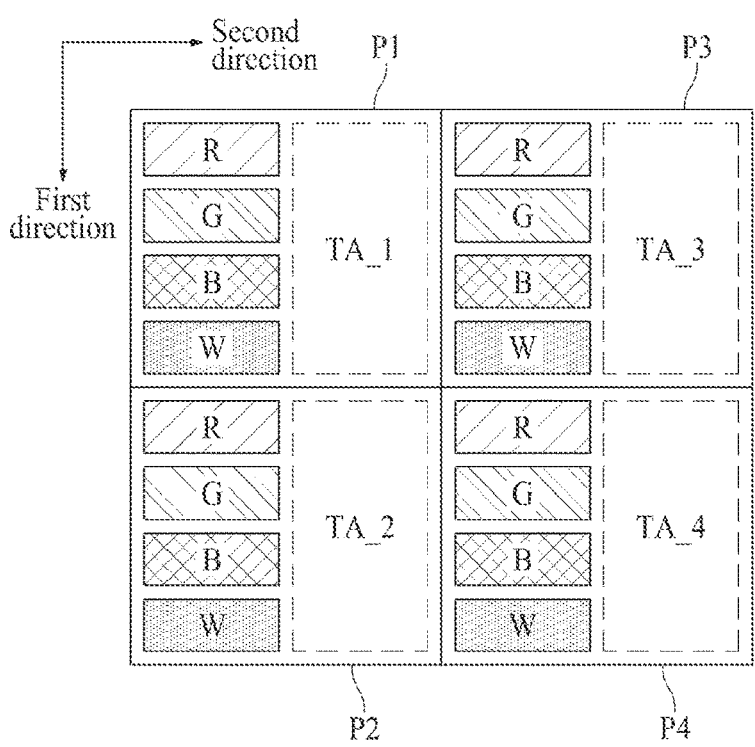
FIGS. 3 and 4 are exemplary views illustrating an arrangement structure of a transmission area and a sub pixel in a pixel according to one embodiment of the present disclosure.
Figure 4:
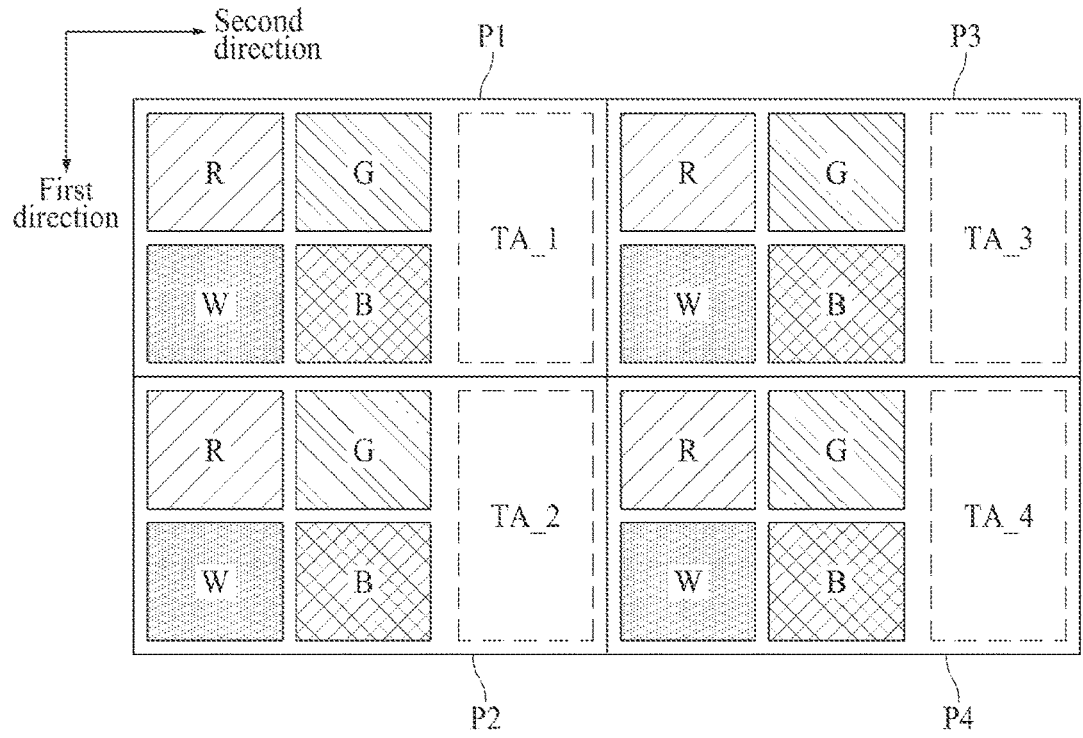

In FIGS. 3 and 4, explained after FIG. 2, one pixel (P) includes the transmission area (TA), but not limited to this structure. The pixel (P) of the organic light emitting display apparatus according to one embodiment of the present disclosure may be the organic light emitting display apparatus which does not include the transmission area (TA).

Referring to FIG. 2, in one pixel (P), the sub pixels (SP_1, . . . , SP_k) may be disposed to be adjacent in a first direction. Referring to FIG. 2, the transmission area (TA) may be disposed to be adjacent to the sub pixel area (SPA) in a second direction. That is, the transmission area (TA) may be disposed to be adjacent to the sub pixels (SP_1, . . . , SP_k) in the second direction.

As described above, each unit pixel (P) includes the transmission area (TA), whereby each unit pixel (P) may have a transparent structure. Owing to the structure of the pixel (P) comprising the transmission area (TA), the organic light emitting display apparatus 100 according to the present disclosure may pass ambient light. Accordingly, the organic light emitting display apparatus 100 according to the present disclosure may be the transparent organic light emitting display apparatus.

FIGS. 3 and 4 are exemplary views illustrating an arrangement structure of a transmission area and a sub pixel in a pixel according to one embodiment of the present disclosure. Referring to FIGS. 3 and 4, in case of a pixel arrangement structure based on 4-sub pixel, each of the plurality of pixels (P1, P2, P3, P4) may include all sub pixels corresponding to red (R), green (G), blue (B), and white (W) colors. Also, the sub pixels in each pixel may have a color arrangement order which is arranged in accordance with a predetermined order of red (R), green (G), blue (B), and white (W) colors. Also, the area defined by the plurality of sub pixels may be defined as an emission area, and each of the pixels may include a transmission area corresponding to the arrangement structure of the sub pixels.

Referring to FIG. 3, the sub pixels of the first pixel (P1) may be sequentially arranged along the first direction in order of red (R), green (G), blue (B), and white (W) colors. The sub pixels in each of the second pixel (P2), the third pixel (P3), and the fourth pixel (P4) may be arranged in the same order as the above. The first pixel (P1), the second pixel (P2), the third pixel (P3), and the fourth pixel (P4) may include transmission areas (TA_1, TA_2, TA_3, TA_4) corresponding to the sub pixels included in each pixel.

Referring to FIG. 4, the sub pixels of the first pixel (P1) corresponding to red (R), green (G), blue (B), and white (W) colors are respectively disposed in first, second, third, and fourth quadrants, to thereby provide a quadrangle-shaped sub pixel structure. The sub pixels of each of the second pixel (P2), the third pixel (P3), and the fourth pixel (P4) may be disposed in the same method as the above. The first pixel (P1), the second pixel (P2), the third pixel (P3), and the fourth pixel (P4) may include transmission areas (TA_1, TA_2, TA_3, TA_4) corresponding to the sub pixels included in each pixel.

The arrangement structure of the sub pixels and the transmission area is not limited to those of FIGS. 2 to 4, and the arrangement structure of the sub pixels and the transmission area may be designed in various ways.

Figure 5A:
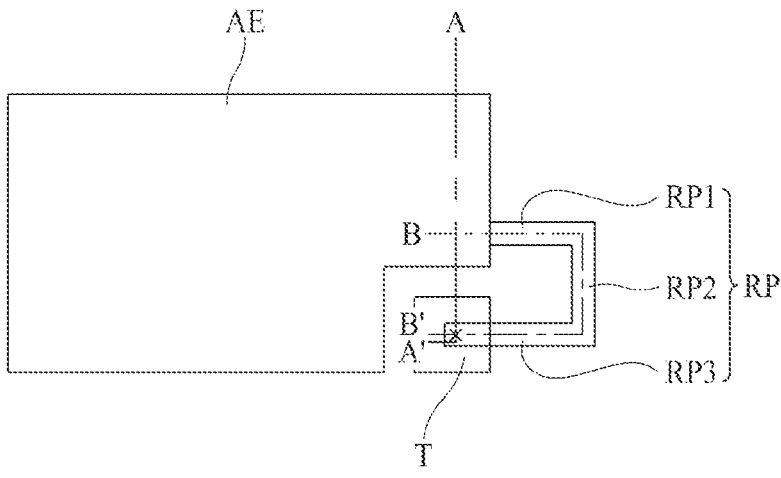
FIG. 5A briefly illustrates an anode electrode, a repair portion and a driving thin film transistor in a sub pixel of an organic light emitting display apparatus according to the present disclosure.
Figure 5B:
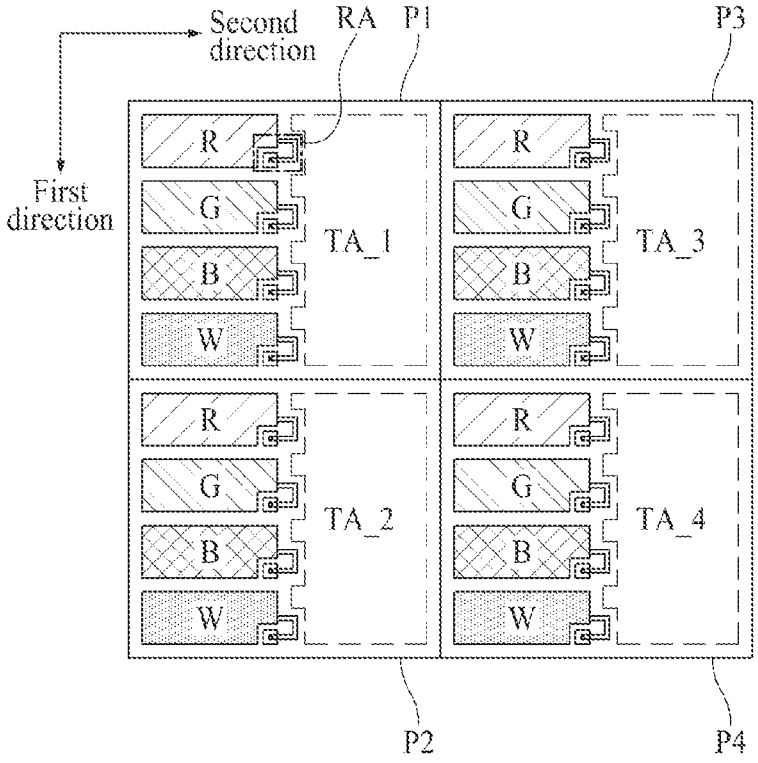
FIG. 5B is a plane view illustrating a plurality of pixel areas comprising a repair area according to the present disclosure.

FIG. 5A briefly illustrates an anode electrode, a repair portion, and a driving thin film transistor in a sub pixel of an organic light emitting display apparatus according to the present disclosure. FIG. 5B is a plane view illustrating a plurality of pixel areas comprising a repair area according to the present disclosure.

Referring to FIG. 5A, an anode electrode (AE) of an organic light emitting diode may be connected with a driving thin film transistor (T) through a repair portion (RP) formed at one side of the anode electrode (AE). Also, the repair portion (RP) may be connected with the driving thin film transistor (T) through a contact hole, and the driving thin film transistor (T) may be disposed to be adjacent to one side of the anode electrode (AE) of the organic light emitting diode in accordance with the design of the organic light emitting display apparatus, and may be not overlapped with the anode electrode (AE). Accordingly, the anode electrode (AE) may be electrically connected with the driving thin film transistor (T) through the repair portion (RP).

According to one embodiment of the present disclosure, the repair portion (RP) may include a first repair portion (RP1) disposed to be adjacent to the organic light emitting diode, a second repair portion (RP2) which extends from the first repair portion (RP1), is bent at a predetermined angle with respect to first repair portion (RP1) and is configured to have at least one cutting point, and a third repair portion (RP3) which extends from the second repair portion (RP2), is bent at a predetermined angle with respect to second repair portion (RP2) and is connected with the driving thin film transistor (T). The repair portion (RP) may be provided in a shape protruding from one side of the sub pixel or the anode electrode (AE) of the organic light emitting diode. The structure of the repair portion (RP) comprising the first repair portion (RP1), the second repair portion (RP2), and the third repair portion (RP3) will be described in detail with reference to FIGS. 6A, 6B and 6C.

Referring to FIG. 5B, each of the pixels (P1, P2, P3, P4) may include a repair area (RA) formed at one side of the plurality of sub pixels (R, G, B, W). In other words, the pixel according to the present disclosure may further include the repair area (RA) disposed between the transmission area (TA) and the emission area (EA) defined by the plurality of sub pixels. Also, the repair area (RA) may be defined as the area being overlapped with the area prepared with the repair portion (RP) comprising the first repair portion (RP1), the second repair portion (RP2), and the third repair portion (RP3).

Also, as shown in FIG. 5B, if the repair area (RA) formed at one side of each of the sub pixels in each pixel (P1, P2, P3, P4) of the organic light emitting display apparatus according to the present disclosure is formed in the protruding shape, the transmission area (TA) may be formed in a polygonal shape corresponding to the protruding shape of the repair area (RA).

However, the structure of the repair area (RA) is not limited to the above. The repair area (RA) may be formed in any shape protruding from the organic light emitting diode or one side of the anode electrode (AE) of the organic light emitting diode in order to form at least one cutting point comprising the first cutting point (CP1) of the second repair portion (RP2) to be explained later.

In FIG. 5B, the transmission area (TA) may have a deposition structure comprising a buffer layer 220, an inter-layer dielectric 240, a passivation layer 250 and a planarization layer 260 sequentially deposited on a substrate 210, but not limited to this structure. The transmission area (TA) may have any deposition structure generally known to those in the art.

Figure 6A:
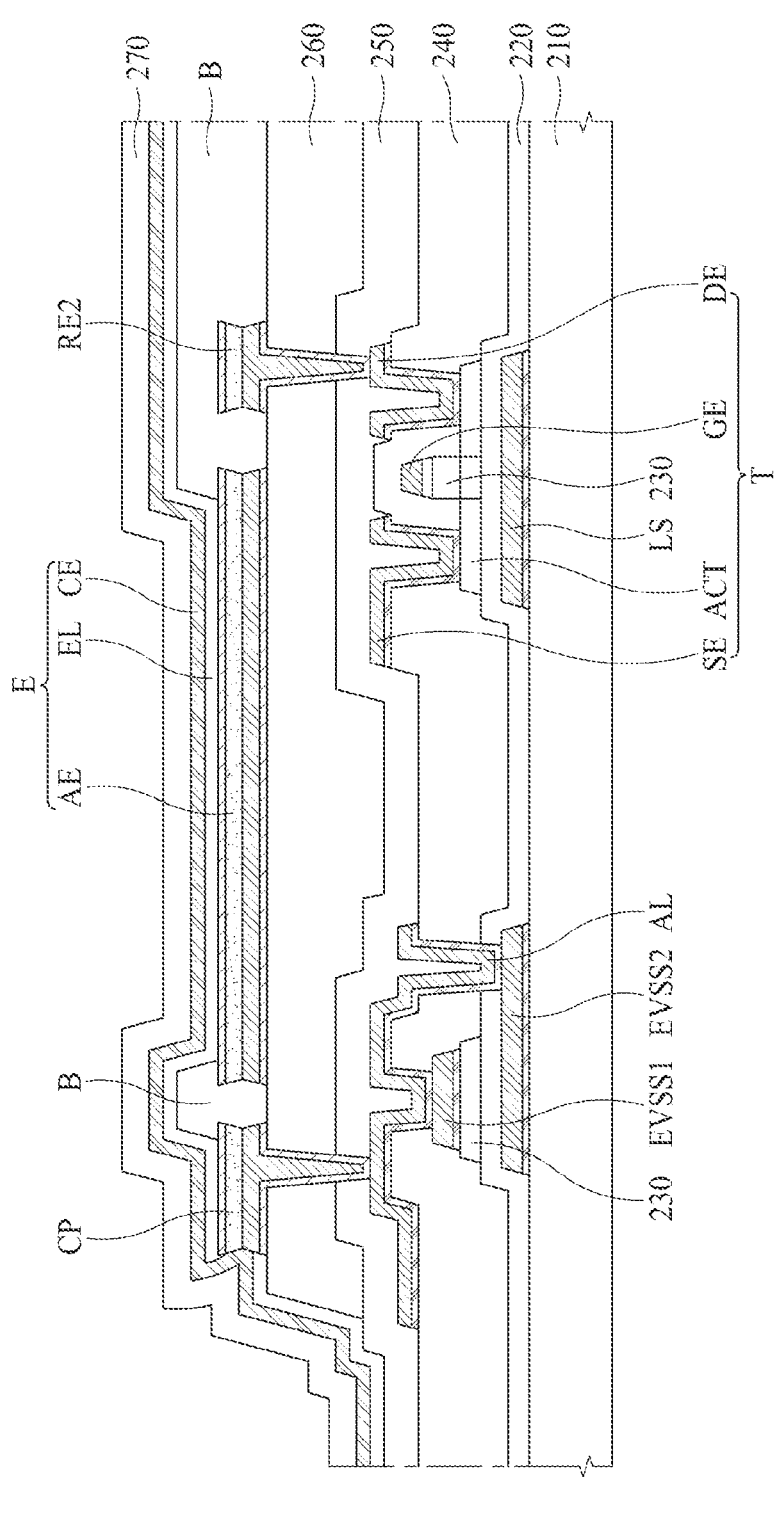
FIG. 6A is a cross sectional view along line A-A' of FIG. 5A.
Figure 6B:
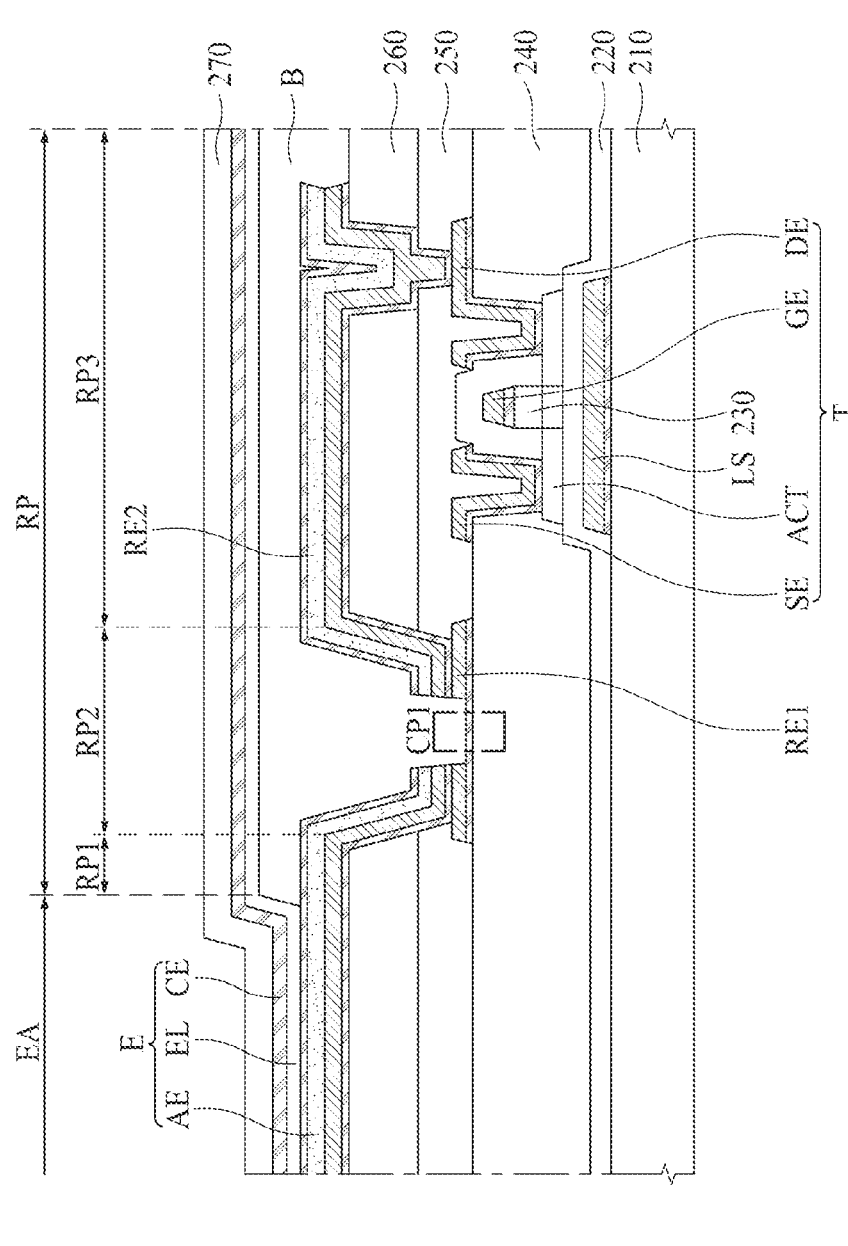
FIG. 6B is a cross sectional view along line B-B' of FIG. 5A.
Figure 6C:
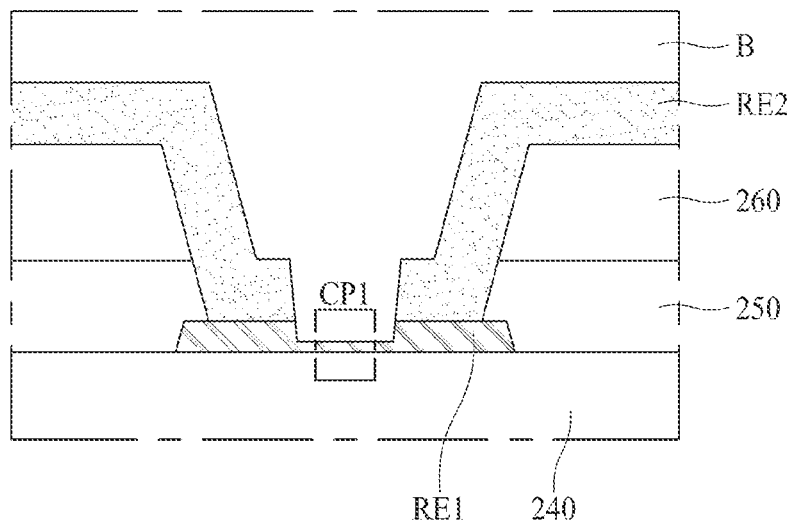
FIG. 6C is an expanded view illustrating a repair portion of FIG. 6B.

FIG. 6A is a cross sectional view along line A-A' of FIG. 5A. FIG. 6B is a cross sectional view along line B-B' of FIG. 5A. FIG. 6C is an expanded view illustrating a repair portion of FIG. 6B.

Referring to FIGS. 6A and 6B, the organic light emitting display apparatus 100 may include the substrate 210, the driving thin film transistor (T) and first and second auxiliary power lines (EVSS1, EVSS2) formed on the substrate 210, a contact pad (CP) electrically connected with the first and second auxiliary power lines (EVSS1, EVSS2), the organic light emitting diode (E), and the repair portion (RP) formed at one side of the organic light emitting diode (E).

The substrate 210 is a base substrate, which may be a transparent flexible substrate capable of being bent, or a glass substrate. According to one embodiment of the present disclosure, the substrate 210 may include a polyimide material, but not limited to this material. The substrate 210 may be formed of a transparent plastic material such as polyethylene terephthalate. According to one embodiment of the present disclosure, the substrate 210 may include a main component of silicon oxide ($SiO_2$) or aluminum oxide ($Al_2O_3$).

The driving thin film transistor (T) may be disposed in each of the plurality of sub pixels on the buffer layer 220.

According to one embodiment of the present disclosure, the driving thin film transistor may include an active layer (ACT), a gate electrode (GE) formed on the active layer (ACT), a gate insulating film 230 disposed between the active layer (ACT) and the gate electrode (GE), a source electrode (SE) being in contact with one side of the active layer (ACT), and a drain electrode (DE) being in contact with the other side of the active layer (ACT). The driving thin film transistor may further include an interlayer dielectric 240 configured to electrically insulate the gate electrode (GE) from the source electrode (SE) and the drain electrode (DE), and to protect the driving thin film transistor.

The active layer (ACT) may be prepared in the pixel area of the substrate 210. The active layer (ACT) may be overlapped with the gate electrode (GE), the source electrode (SE) and the drain electrode (DE), the active layer (ACT) may include a channel region, and source/drain regions, wherein the channel region may be formed in a central area of the active layer (ACT), and the source/drain regions may be disposed to be parallel to each other under the circumstances that the channel region is disposed in-between. In detail, the gate insulating film 230 may be disposed on the channel region of the active layer (ACT), and may be configured to insulate the active layer (ACT) and the gate electrode (GE) from each other, and the gate electrode (GE) may be prepared on the gate insulating film 230.

The active layer (ACT) of the thin film transistor (T) may be formed of polycrystalline silicon. The active layer (ACT) may be manufactured by depositing amorphous silicon (a-Si) on the buffer layer, forming poly-silicon by carrying out dehydrogenation, crystallization, activation and hydrogenation processes, and patterning the poly-silicon. If the active layer (ACT) is formed of polycrystalline silicon, the thin film transistor (T) may be a low temperature poly-silicon thin film transistor (T) using low temperature poly-silicon (LTPS). The poly-silicon material has high mobility. Thus, if the active layer (ACT) is formed of the poly-silicon material, it has advantages of low power consumption and good reliability.

The gate electrode (GE) may apply a gate voltage to the active layer (ACT) of the driving thin film transistor (T). As shown in FIG. 6A, the gate electrode (GE) may be formed in a dual-layered structure. However, the gate electrode (GE) may be formed in a single-layered structure. According to one embodiment of the present disclosure, the gate electrode (GE) may include a metal material such as molybdenum (Mo), but not limited to this material. The gate electrode (GE) may include any metal material generally known to those in the art without limitation.

The source electrode (SE) and the drain electrode (DE) are configured to form an ohmic contact with a source region and a drain region of the active layer (ACT), and the source electrode (SE) and the drain electrode (DE) may be formed of a metal material with a low resistance. FIG. 6A shows that each of the source electrode (SE) and the drain electrode (DE) is formed in a dual-layered structure. According to one embodiment of the present disclosure, each of the source electrode (SE) and the drain electrode (DE) may be formed in a dual-layered structure obtained by depositing aluminum (Al) and titanium (Ti). Also, according to another embodiment of the present disclosure, each of the source electrode (SE) and the drain electrode (DE) may be formed in a three-layered structure obtained by depositing titanium (Ti)/aluminum (Al)/titanium (Ti).

The interlayer dielectric 240 may be prepared to cover the gate electrode (GE), and the interlayer dielectric 240 may protect the thin film transistor (T). A predetermined area of the interlayer dielectric 240 may be removed so as to bring the active layer (ACT) in contact with the source electrode (SE) or the drain electrode (DE). For example, the interlayer dielectric 240 may include a contact hole through which the source electrode (SE) penetrates, and a contact hole through which the drain electrode (DE) penetrates. According to one embodiment of the present disclosure, the interlayer dielectric 240 may include a silicon oxide film ($SiO_2$) or a silicon nitride film (SiN), or may be formed of a plurality of layers comprising a silicon oxide film ($SiO_2$) and a silicon nitride film (SiN).

The passivation layer 250 may be prepared on the interlayer dielectric 240, the source electrode (SE) and the drain electrode (DE). The passivation layer 250 may protect the source electrode (SE) and the drain electrode (DE). The passivation layer 250 may include a contact hole through which the anode electrode (AE) penetrates. Herein, the contact hole of the passivation layer 250 may be connected with the contact hole of the planarization layer 260 so that the anode electrode (AE) penetrates therethrough. Also, according to one embodiment of the present disclosure, the passivation layer 250 may include a silicon oxide film ($SiO_2$) or a silicon nitride film (SiN).

The planarization layer 260 is disposed on the substrate 210, and is configured to cover the thin film transistor (T) disposed in each of the plurality of pixel areas. In detail, the planarization layer 260 is prepared on the thin film transistor (T), and may be configured to planarize an upper end of the thin film transistor (T). According to one embodiment of the present disclosure, the anode electrode (AE) and the contact pad (CP) may be prepared to be apart from each other in the upper end of the planarization layer 260. For example, the planarization layer 260 may include resin such as photo acryl and polyimide.

The organic light emitting diode (E) may be disposed on the planarization layer 260 for the sub pixel in the plurality of pixel areas. The organic light emitting diode (E) may include the anode electrode (AE) connected with the repair portion (RP), an emission layer (EL) formed on the anode electrode (AE), and the cathode electrode (CE) formed on the emission layer (EL).

The anode electrode (AE) may be prepared on the planarization layer 260 in the plurality of pixel areas. As shown in FIG. 6A, the anode electrode (AE) may be formed in a deposition structure by sequentially depositing a first anode electrode, a second anode electrode, a third anode electrode and a fourth anode electrode, but not limited to this structure.

According to one embodiment of the present disclosure, the anode electrode (AE) may be formed in the same layer as the contact pad (CP) and the second repair electrode (RE2), and may be manufactured by the same process as the contact pad (CP) and the second repair electrode (RE2). In case of the organic light emitting display apparatus 100 according to the present disclosure, the physical contact and electrical contact of the cathode electrode (CE) and the contact pad (CP) in the organic light emitting diode (E) may be carried out by the following deposition process of the cathode electrode (CE) and the emission layer (EL) of the organic light emitting diode (E) without an additional mask and process. Preferably, the physical contact and electrical contact of the cathode electrode (CE) and the contact pad (CP) in the organic light emitting diode (E) may be performed through the exposed lateral surface of the contact pad (CP). In order to realize the stable contact between the lateral surface of the contact pad (CP) and the cathode electrode (CE), the contact pad (CP) is configured to have a predetermined thickness or more.

According to one embodiment of the present disclosure, the thickness of the anode electrode (AE) according to one embodiment of the present disclosure is two times to five times larger than a thickness of a general anode electrode (AE). For example, if the thickness of the anode electrode (AE) may be 300 nm-500 nm, and the anode electrode (AE) having the thickness of 300 nm-500 nm includes the plurality of layers comprising the first anode electrode, the second anode electrode, the third anode electrode and the fourth anode electrode, as described above, the central-positioned anode electrode and the lateral-positioned anode electrode with respect to the thickness of the anode electrode (AE) are formed of materials with different levels of selectivity so that the exposed lateral surface of the anode electrode (AE) is formed in shape of eaves having an inclination toward the inside.

For example, with respect to the thickness of the anode electrode (AE), the lateral portion may be formed of transparent conductive oxide (TCO) including Indium Tin Oxide (ITO) or Indium Zinc Oxide (IZO), and the central portion includes an anode electrode layer having at least one among molybdenum titanium alloy (MoTi), aluminum (Al), silver (Ag), molybdenum (Mo) and Titanium (Ti), or may further include an anode electrode layer comprising a material with a high etching rate, for example, copper (Cu).

The contact pad (CP) is spaced apart from one side of the anode electrode (AE), and is disposed on the planarization layer 260. The contact pad (CP) may be disposed to be apart from the anode electrode (AE) on the planarization layer 260, and one side of the lateral surface portion of the contact pad (CP) may be overlapped with a bank (B), and the other side of the lateral surface portion of the contact pad (CP) may have the exposed lateral surface structure for the electrical contact with the cathode electrode (CE).

According to one embodiment of the present disclosure, with respect to the thickness of the contact pad (CP), the lateral portion may be formed of transparent conductive oxide (TCO) including Indium Tin Oxide (ITO) or Indium Zinc Oxide (IZO), and the central portion includes a contact pad layer having at least one among molybdenum titanium alloy (MoTi), aluminum (Al), silver (Ag), molybdenum (Mo) and Titanium (Ti), or may further include a contact pad layer comprising a material with a high etching rate, for example, copper (Cu). According to one embodiment of the present disclosure, the contact pad (CP) may have a thickness of 300 nm-500 nm. One side of the contact pad (CP) may be covered by the bank (B), and the emission layer (EL), the cathode electrode (CE), and the encapsulation layer 270 may be sequentially deposited on the bank (B) of the contact pad (CP). However, an upper structure of the contact pad (CP) is not limited to the above structure.

For the electrical contact with the first and second auxiliary power lines (EVSS1, EVSS2), the contact pad (CP) may be connected with an auxiliary line (AL) through the contact hole of the planarization layer 260 and the passivation layer 250. As described above, the contact pad (CP) may be formed of the same material as that of the anode electrode (AE), and may be manufactured by the same process as that of the anode electrode (AE), whereby the contact pad (CP) may be formed on the planarization layer 260 while being apart from the anode electrode (AE).

Referring to FIG. 6A, the second repair electrode (RE2) may be formed on the planarization layer 260 to be apart from one side of the anode electrode (AE) of the organic light emitting diode (E), and the second repair electrode (RE2) may be electrically connected with the driving thin film transistor (T). Also, some portion of the second repair electrode (RE2) being connected with the driving thin film transistor (T) through the contact hole may be the third repair portion (RP3). The second repair electrode (RE2) may be disposed in the same layer as the anode electrode (AE), may be formed of the same material as that of the anode electrode (AE), may be manufactured by the same process as that of the anode electrode (AE), and may be obtained by a predetermined patterning process.

According to one embodiment of the present disclosure, with respect to a thickness of the second repair electrode (RE2), the lateral portion may be formed of transparent conductive oxide (TCO) including Indium Tin Oxide (ITO) or Indium Zinc Oxide (IZO), and the central portion include a second repair electrode layer having at least one among molybdenum titanium alloy (MoTi), aluminum (Al), silver (Ag), molybdenum (Mo) and Titanium (Ti), or may further include a second repair electrode layer comprising a material with a high etching rate, for example, copper (Cu). According to one embodiment of the present disclosure, the second repair electrode (RE2) may have a thickness of 300 nm-500 nm. An exposed portion of the second repair electrode (RE2) may be covered by the bank (B), and the emission layer (EL), the cathode electrode (CE) and the encapsulation layer 270 may be sequentially deposited on the bank (B) of the second repair electrode (RE2). However, an upper structure of the second repair electrode (RE2) is not limited to the above structure.

The emission layer (EL) may be prepared on the anode electrode (AE) and the contact pad (CP). The emission layer (EL) may be formed for the entire pixel areas in common, however, the emission layer (EL) is not divided into each of the pixel areas. For example, the emission layer (EL) may include a hole transporting layer, an organic light emitting layer, and an electron transporting layer. According to one embodiment of the present disclosure, the emission layer (EL) may further include at least one functional layer so as to improve a light emission efficiency of the emission layer and to increase a lifespan of the emission layer.

According to one embodiment of the present disclosure, the emission layer (EL) is in contact with the upper surface of the contact pad (CP), but may be not in contact with some portion of the lateral surface of the contact pad (CP). In detail, the lateral surface exposed at the other side of the contact pad (CP) may be formed in a groove shape with respect to a thickness direction of the contact pad (CP), and the upper portion of the contact pad (CP) may have the shape of eaves. Accordingly, the emission layer (EL) may have a disconnected structure at the lateral surface of the contact pad (CP) by the eaves-shaped upper portion of the contact pad (CP), and may be not in contact with the lateral surface exposed at the other side of the contact pad (CP). As a result, in case of the display apparatus according to the present disclosure, the emission layer (EL) may be not in contact with the exposed lateral surface of the contact pad (CP). Thus, as shown in FIG. 6A, if forming the cathode electrode (CE) of the organic light emitting diode (E), it may have the structure being in contact with the exposed lateral surface of the contact pad (CP).

The cathode electrode (CE) may be prepared on the emission layer (EL). The cathode electrode (CE) may be formed as a common electrode type for all the pixel areas without being divided into each of the pixel areas. According to one embodiment of the present disclosure, the cathode electrode (CE) may be formed of transparent conductive oxide (TCO) such as Indium Tin Oxide (ITO) or Indium Zinc Oxide (IZO). As described above, the cathode electrode (CE) may be in direct contact with the exposed lateral surface of the contact pad (CP) in which the emission layer (EL) is not formed.

The first auxiliary power line (EVSS1) is electrically connected with the contact pad (CP) through the auxiliary line (AL), is disposed in the same layer as that of the gate electrode (GE), and is formed of the same material as that of the gate electrode (GE). In detail, the first auxiliary power line (EVSS1) may be disposed on the gate insulating film 230. The second auxiliary power line (EVSS2) is electrically connected with the contact pad (CP) through the auxiliary line (AL), is disposed in the same layer as a light shielding layer (LS), and is formed of the same material as that of the light shielding layer (LS). In detail, the second auxiliary power line (EVSS2) may be disposed on the substrate 210. Accordingly, the first and second auxiliary power lines (EVSS1, EVSS2) may be electrically connected with the contact pad (CP) through the auxiliary line (AL) so that it is possible to reduce an entire resistance of the electrodes connected with the contact pad (CP).

Also, as shown in FIG. 6A, the contact pad (CP) and the auxiliary power lines (EVSS1, EVSS2) are positioned in the cutting line A-A'. The position of the contact pad (CP) and the auxiliary power lines (EVSS1, EVSS2) is not limited to the cutting line A-A'. The contact pad (CP) and the auxiliary power lines (EVSS1, EVSS2) may be formed in various positions without limitations in accordance with a design condition of the organic light emitting display apparatus.

Also, the organic light emitting display apparatus 100 according to one embodiment of the present disclosure may further include the light shielding layer (LS), and the light shielding layer (LS) may be disposed on the substrate 210 to be overlapped with the thin film transistor (T). For example, the light shielding layer (LS) may be manufactured by depositing metal on the substrate 210, and patterning the deposited metal by an exposure process.

Also, the organic light emitting display apparatus 100 according to one embodiment of the present disclosure may further include the buffer layer 220, and the buffer layer 220 may be disposed on the substrate 210 and the light shielding layer (LS). According to one embodiment of the present disclosure, the buffer layer 220 may be formed by depositing a plurality of inorganic films. For example, the buffer layer 220 may be formed of a multi-layered structure obtained by depositing at least one inorganic film among a silicon oxide film (SiOx), a silicon nitride film (SiN) and a silicon oxide nitride film (SiON). The buffer layer 220 may be formed on an entire upper surface of the substrate 210 so as to prevent a moisture permeation into the organic light emitting diode (E) through the substrate 210.

As shown in FIG. 6A, in case of the organic light emitting display apparatus 100 according to one embodiment of the present disclosure, the drain electrode (DE) of the driving thin film transistor (T) is not directly electrically connected with the anode electrode (AE) of the organic light emitting diode (E), but electrically connected with the second repair electrode (RE2). If the second repair electrode (RE2) of FIG. 6A is explained in connection with FIG. 6B, some portion of the second repair electrode (RE2), which is electrically connected with at least some portion of the driving thin film transistor (T), may be defined as the third repair portion (RP3).

FIG. 6B is a cross sectional view along line B-B' of FIG. 5A, and FIG. 6C expands and shows the repair portion of FIG. 6B.

Referring to FIG. 6B, the organic light emitting display apparatus 100 according to one embodiment of the present disclosure may include the emission area (EA) defined by the bank (B) and the anode electrode (AE) of the organic light emitting diode (E), and the repair portion (RP) formed at one side of the emission area (EA).

The emission area (EA) of the organic light emitting display apparatus 100 may be defined as the area which is overlapped with the anode electrode (AE), the emission layer (EL) and the cathode electrode (CE) of the organic light emitting diode (E), and is divided by the bank (B).

The repair portion (RP) may be defined as an area extending from one side of the emission area (EA), wherein the repair portion (RP) may be defined as the area provided with the first repair electrode (RE1) and/or second repair electrode (RE2) for the electrical connection of the anode electrode (AE) of the organic light emitting diode (E) and the driving thin film transistor (T).

Also, the repair portion (RP) may include the first repair portion (RP1) in which the second repair electrode (RE2) connected with the anode electrode (AE) is formed on the planarization layer 260; the second repair portion (RP2) extending from the first repair portion (RP1), which is provided with the planarization layer 260 and the first repair electrode (RE1) formed on the interlayer dielectric 240, the sidewall formed by etching at least some portion of the passivation layer 250, and the second repair electrode (RE2) overlapped with at least some portion of the first repair electrode (RE1); and the third repair portion (RP3) extending from the second repair portion (RP2), in which the second repair electrode (RE2) is formed on the planarization layer 260 and electrically connected with the driving thin film transistor (T).

Also, the second repair portion (RP2) may further include the first cutting point (CP1) which is formed by etching at least some portions of the first repair electrode (RE1) and the second repair electrode (RE2). If at least some portions of the first repair electrode (RE1) and the second repair electrode (RE2) are etched so as to form the first cutting point (CP1), the remaining thickness in each of the first repair electrode (RE1) and the second repair electrode (RE2) may be adjusted in consideration of the relative etching rate of the first repair electrode (RE1) and the second repair electrode (RE2) so that they may be easily cut by a following general repair cutting process. According to one embodiment of the present disclosure, all the second repair electrode (RE2) may be etched in the area corresponding to the first cutting point (CP1), and only the half of the first repair electrode (RE1) may be etched in the area corresponding to the first cutting point (CP1), but not limited to this structure.

As described above, the first repair electrode (RE1) may be provided on the interlayer dielectric 240, may be disposed in the same layer as the source electrode (SE) and the drain electrode (DE) provided in the interlayer dielectric 240, may be manufactured by the same process as that of the source electrode (SE) and the drain electrode (DE) provided in the interlayer dielectric 240, and may be obtained by a predetermined patterning process. According to one embodiment of the present disclosure, the first repair electrode (RE1) may be formed of the same material as those of the source electrode (SE) and the drain electrode (DE). For example, the first repair electrode (RE1) may be formed in a dual-layered structure obtained by depositing aluminum (Al) and titanium (Ti), or a three-layered structure obtained by depositing titanium (Ti)/aluminum (Al)/titanium (Ti). The first repair electrode (RE1) may have a thickness of 300 nm-700 nm. As described above, the predetermined area overlapped with the area of forming the first repair electrode (RE1) may be defined as the second repair portion (RP2), and may include at least one cutting point including the first cutting point (CP1), and may be the area for the repair process of the organic light emitting display apparatus 100.

At least some portion of the second repair electrode (RE2) may be formed to be overlapped with the first repair electrode (RE1) of the second repair portion (RP2), the second repair electrode (RE2) may be formed on the sidewall formed by etching at least some portions of the planarization layer 260 and the passivation layer 250 in the second repair portion (RP2), and the second repair electrode (RE2) may be formed on the planarization layer 260 of the first repair portion (RP1) and the third repair portion (RP3). The second repair electrode (RE2) may be formed in the same layer as the anode electrode (AE) of the emission area (EA), and may be obtained by a predetermined patterning process.

Herein, the same layer indicates not only the single layer such as the planarization layer 260 or the passivation layer 250, but also the sidewall formed by etching at least some portions of the planarization layer 260 and the interlayer dielectric 240 in the area corresponding to the second repair portion (RP2), and the outermost layer exposed to the external and configured to have the predetermined profile before the process of the second repair electrode (RE2) of the organic light emitting display apparatus 100 according to the present disclosure, for example, the first repair electrode (RE1) of the second repair portion (RP2).

As shown in FIG. 6B, the anode electrode (AE) of the organic light emitting diode (E) is not directly electrically connected with the driving thin film transistor (T), but electrically connected with the driving thin film transistor (T) through the first repair electrode (RE1) and the second repair electrode (RE2) of the repair portion (RP). First, according as a control signal provided from the external is applied to the driving thin film transistor (T) through the gate driver 130 and the data driver 140, the driving thin film transistor (T) is turned on so that a current may be supplied to the drain electrode (DE). Then, the current may be supplied to the second repair electrode (RE2) of the third repair portion (RP3) electrically connected with the drain electrode (DE) of the driving thin film transistor (T).

If all the second repair electrode (RE2) corresponding to the first cutting point (CP1) of the second repair portion (RP2) is not etched, the current may be supplied through a current path comprising the second repair electrode (RE2) of the third repair portion (RP3) and the second repair electrode (RE2) of the second repair portion (RP2), and then may be supplied to the anode electrode (AE) of the organic light emitting diode (E) connected with the second repair electrode (RE2) of the first repair portion (RP1).

If all the second repair electrode (RE2) corresponding to the first cutting point (CP1) of the second repair portion (RP2) is etched, the current which is supplied to the second repair electrode (RE2) of the third repair portion (RP3) may be transmitted to the second repair electrode (RE2) of the first repair portion (RP1) through the first repair electrode (RE1) and the second repair electrode (RE2) in the second repair portion (RP2) by the use of current path of the first repair electrode (RE1) electrically connected with the second repair electrode (RE2) in the second repair portion (RP2), and then may be supplied to the anode electrode (AE) of the organic light emitting diode (E) connected with the second repair electrode (RE2).

Referring to FIG. 6C, the first cutting point (CP1) may be formed by etching at least some portions of the first repair electrode (RE1) and the second repair electrode (RE2). If the sub pixel has problems related with brightness (bright spots), the first cutting point (CP1), which is formed by etching at least some portions of the first repair electrode (RE1) and the second repair electrode (RE2), may provide the structure appropriate for the repair process. In FIG. 6B, each of the first repair electrode (RE1) and the second repair electrode (RE2) is formed of the plurality of layers. For convenience of explanation, FIG. 6C shows that each of the first repair electrode (RE1) and the second repair electrode (RE2) is formed in the single-layered structure. Also, both the single-layered structure and the multi-layered structure in each of the first repair electrode (RE1) and the second repair electrode (RE2) may be included in the scope of the present disclosure.

As shown in FIG. 6C, the thickness of the area for the first cutting point (CP1) is relatively smaller than the thickness of the remaining areas without the first cutting point (CP1), whereby it facilitates the repair process. For example, if the repair process is selectively carried out for the sub pixel having the bright spot after completing the manufacturing process of the organic light emitting display apparatus 100, a laser irradiation process may be performed. As described above, the thickness of the first cutting point (CP1) is relatively smaller than the thickness of the remaining areas without the first cutting point (CP1), for example, the first repair electrode (RE1) and the second repair electrode (RE2) in the second repair portion (RP2), so that it is possible to perform the repair process for the cutting point (CP1) by the laser irradiation having a relatively low energy level. Thus, it is possible to minimize or reduce damages on the organic light emitting diode (E) and the encapsulation layer 270 for the repair process, and to improve reliability of the organic light emitting display apparatus 100. According to one embodiment of the present disclosure, all of the second repair electrode (RE2) may be etched in the first cutting point (CP1) of the second repair portion (RP2), and at least some portion of the first repair electrode (RE1) may be etched in the first cutting point (CP1) of the second repair portion (RP2). Also, according to another embodiment of the present disclosure, all of the second repair electrode (RE2) may be etched in the first cutting point (CP1) of the second repair portion (RP2), and the first repair electrode (RE1) may be not etched in the first cutting point (CP1) of the second repair portion (RP2).

For example, the substrate 210 may be irradiated with laser provided therebelow for the repair process, and the laser irradiation may be focused on the cutting point (CP1) of the preset repair portion (RP) by the use of align pattern of the substrate 210. Any method capable of cutting the predetermined pattern, generally known to those in the art, may be used for the repair process without limitations.

The method of forming the first cutting point (CP1) and the etching process for patterning the anode electrode (AE) of the organic light emitting diode (E) may be carried out at the same time. The second repair electrode (RE2) corresponding to the first cutting point (CP1) of the second repair portion (RP2) may be removed by the etching process.

As described above, the first repair electrode (RE1) may be formed of the same material as those of the source electrode (SE) and the drain electrode (DE) of the driving thin film transistor (T), and the second repair electrode (RE2) may be formed of the same material as that of the anode electrode (AE) of the organic light emitting diode (E).

For example, as described above, the first repair electrode (RE1) may be formed in a single-layered structure of any one material among transparent conductive oxide (TCO) including Indium Tin Oxide (ITO) or Indium Zinc Oxide (IZO), molybdenum titanium alloy (MoTi), aluminum (Al), silver (Ag), molybdenum (Mo), Titanium (Ti) and copper (Cu), or a multi-layered structure of materials selected among transparent conductive oxide (TCO) including Indium Tin Oxide (ITO) or Indium Zinc Oxide (IZO), molybdenum titanium alloy (MoTi), aluminum (Al), silver (Ag), molybdenum (Mo), Titanium (Ti) and copper (Cu); and the second repair electrode (RE2) may be formed in a single-layered structure of any one material selected from aluminum (Al) and titanium (Ti), or a multi-layered structure of aluminum (Al) and titanium (Ti). When selecting the materials for the first repair electrode (RE1) and the second repair electrode (RE2), the first repair electrode (RE1) and the second repair electrode (RE2) are formed of materials with different levels of etch selectivity, to thereby form the first cutting point (CP1). That is, if the first repair electrode (RE1) and the second repair electrode (RE2) are formed of the materials having the different properties, and the etching process is carried out by the use of etchant with high etch selectivity for the second repair electrode (RE2), the first repair electrode (RE1) may serve as one kind of etch stopper, and the remaining thickness of the first repair electrode (RE1) may be controlled by adjusting an etching process time.

Figure 7A:
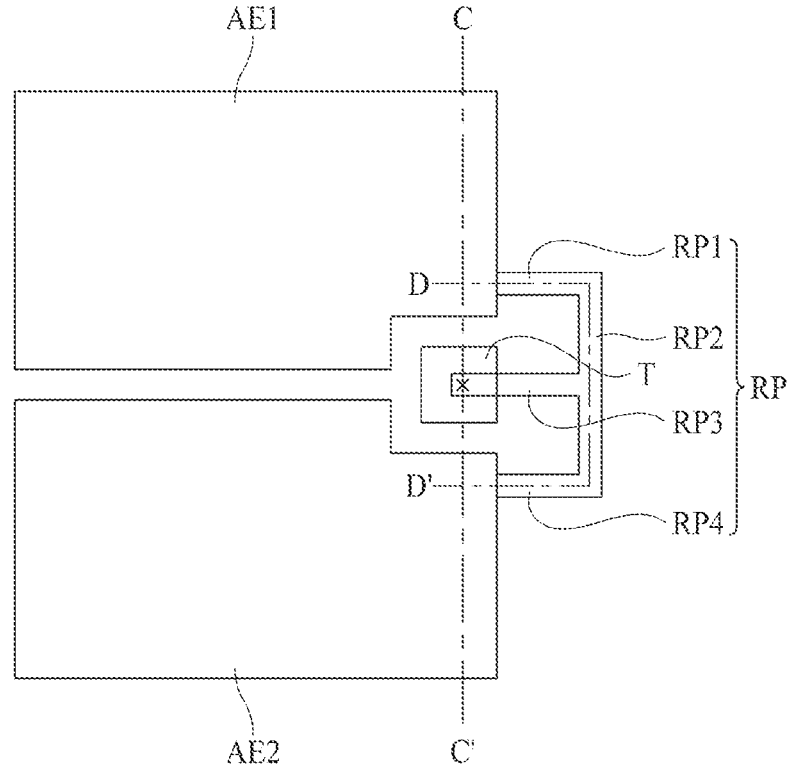
FIG. 7A briefly illustrates an anode electrode, a repair portion and a driving thin film transistor in a sub pixel of an organic light emitting display apparatus according to the present disclosure.
Figure 7B:
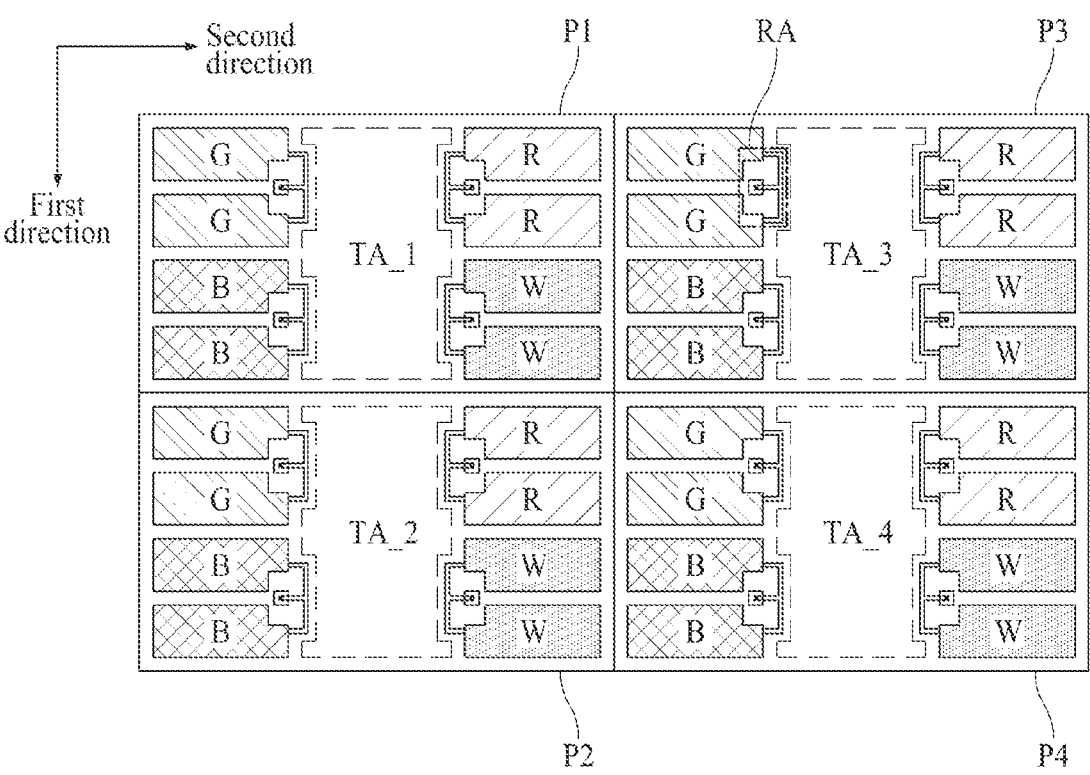
FIG. 7B is a plane view illustrating a plurality of pixel areas comprising a repair area according to the present disclosure.

FIG. 7A briefly illustrates the anode electrode, the repair portion, and the driving thin film transistor in the sub pixel of the organic light emitting display apparatus according to the present disclosure, and FIG. 7B is a plane view illustrating the plurality of pixel areas comprising the repair area according to the present disclosure.

As shown in FIG. 7A, the anode electrode (AE) of the organic light emitting diode included in the sub pixel of the pixel area may be configured to have a partition structure comprising an anode electrode first portion (AE1, anode electrode first portion) and an anode electrode second portion (AE2, anode electrode second portion) which are separated from each other. Accordingly, if the bright spot is generated in the area corresponding to the anode electrode first portion (AE1) and the anode electrode second portion (AE2) provided in the partition structure, the repair process may be selectively carried out for the first cutting point (CP1) and second cutting point (CP2) to be explained later. Thus, if defects of the bright spot are generated in any one area of the anode electrode first portion (AE1) and the anode electrode second portion (AE2), it is possible to use the remaining area except for the defective area.

According to one embodiment of the present disclosure, if the sub pixel of the pixel area is configured to have the partition structure comprising the anode electrode first portion (AE1) and the anode electrode second portion (AE2), the repair portion (RP) may include the first repair portion (RP1) which is provided adjacent to the organic light emitting diode (E) and provided adjacent to the anode electrode first portion (AE1); the fourth repair portion (RP4) which is provided adjacent to the anode electrode second portion (AE2); the second repair portion (RP2) which is configured to connect the first repair portion (RP1) and the fourth repair portion (RP4) with each other and to include the first cutting point (CP1) and the second cutting point (CP2) positioned on the current path of the anode electrode first portion (AE1) and the anode electrode second portion (AE2) from the driving thin film transistor (T); and the third repair portion (RP3) which is branched from the second repair portion (RP2) to the driving thin film transistor (T) and is electrically connected with the driving thin film transistor (T).

Referring to FIG. 7B, each of the pixels (P1, P2, P3, P4) may include the repair area (RA) formed at one side of the plurality of sub pixels (R, G, B, W). In other words, the pixel (P1, P2, P3, P4) according to the present disclosure may further include the repair area (RA) disposed between the transmission area (TA_1, TA_2, TA_3, TA_4) and the emission area defined by the plurality of sub pixels (R, G, B, W). Also, the repair area (RA) may be defined as the area overlapped with the area prepared for the repair portion comprising the first repair portion (RP1), the second repair portion (RP2), the third repair portion (RP3) and the fourth repair portion (RP4) shown in FIG. 7A.

Also, as shown in FIG. 7B, if the repair area (RA) formed at one side of each sub pixel (R, G, B, W) of the pixel (P1, P2, P3, P4) of the organic light emitting display apparatus 100 according to the present disclosure is prepared in the protruding shape, the transmission area (TA_1, TA_2, TA_3, TA_4) may be provided in a polygonal shape corresponding to the protruding shape of the repair area (RA).

However, the structure of the repair area (RA) is not limited to the above structure. The repair area (RA) may be formed in any shape which protrudes from the organic light emitting diode (E) or one side of the anode electrode (AE) of the organic light emitting diode (E) so as to form the first cutting point (CP1) and the second cutting point (CP2).

FIG. 7B shows that the transmission area (TA) is formed in the deposition structure obtained by sequentially depositing the buffer layer 220, the interlayer dielectric 240, the passivation layer 250 and the planarization layer 260 on the substrate 210, but not limited to this structure. The transmission area (TA) may be formed in any deposition structure generally known to those in the art without limitations.

Figure 8A:
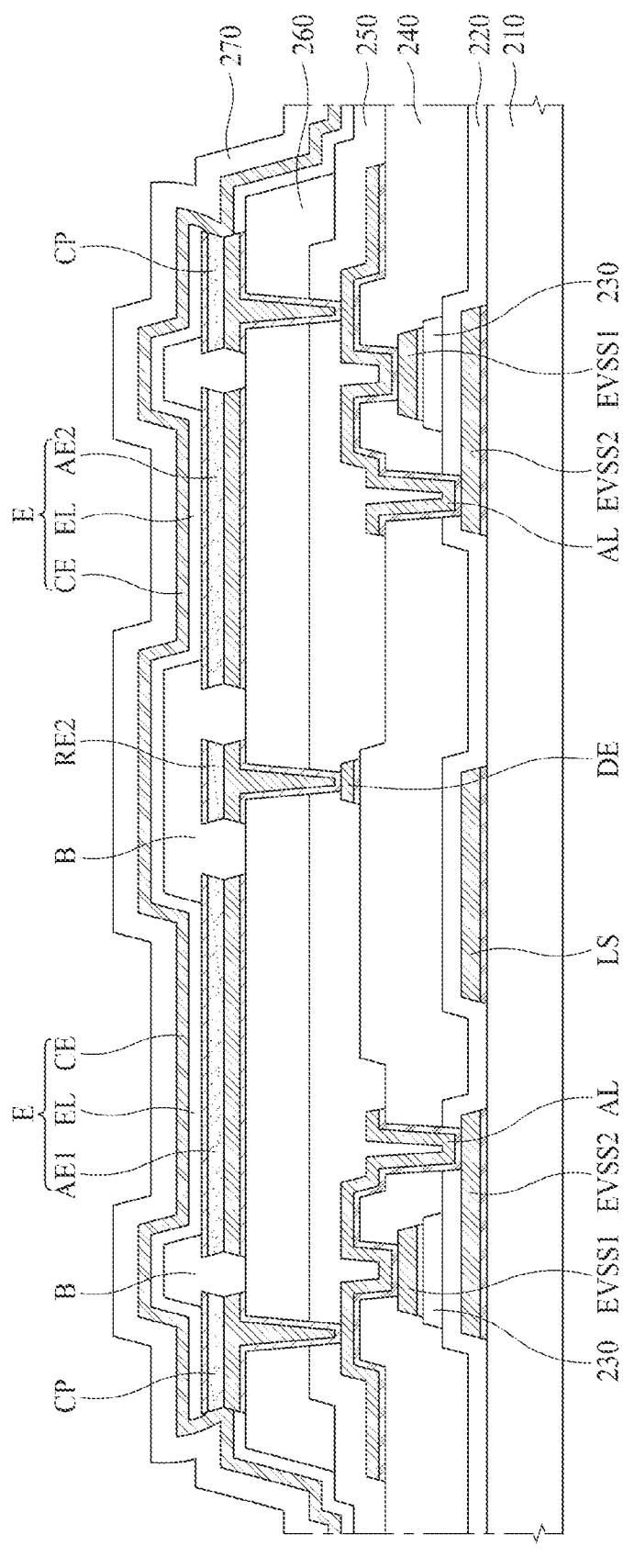
FIG. 8A is a cross sectional view along line C-C' of FIG. 7A.

FIG. 8A is a cross sectional view along line C-C' of FIG. 7. Except that an anode electrode first portion (AE1) and its corresponding organic light emitting diode (E) are symmetrical with an anode electrode second portion (AE2) and its corresponding organic light emitting diode (E) with respect to a driving thin film transistor (T), the cross sectional view of FIG. 8A is the same as the cross sectional view of FIG. 6A, whereby a detailed description for the same parts will be omitted. Also, FIG. 8A shows only a light shielding layer (LS) and a drain electrode (DE) of the driving thin film transistor (T) connected with a second repair electrode (RE2) due to the difference of cutting direction compare to FIG. 6A, FIGS. 8D and 8E.

As shown in FIG. 8A, in case of an organic light emitting display apparatus 100 according to one embodiment of the present disclosure, the drain electrode (DE) of the driving thin film transistor (T) is not directly electrically connected with the anode electrode first portion (AE1) and the anode electrode second portion (AE2) of an organic light emitting diode (E), but electrically connected with a second repair electrode (RE2).

Also, as shown in FIG. 8A, a contact pad (CP) and an auxiliary power line (EVSS1, EVSS2) are positioned in a cutting line of C-C'. The position of the contact pad (CP) and the auxiliary power lines (EVSS1, EVSS2) is not limited to the cutting line C-C'. The contact pad (CP) and the auxiliary power lines (EVSS1, EVSS2) may be formed in various positions without limitations in accordance with a design condition of the organic light emitting display apparatus.

Figure 8B:
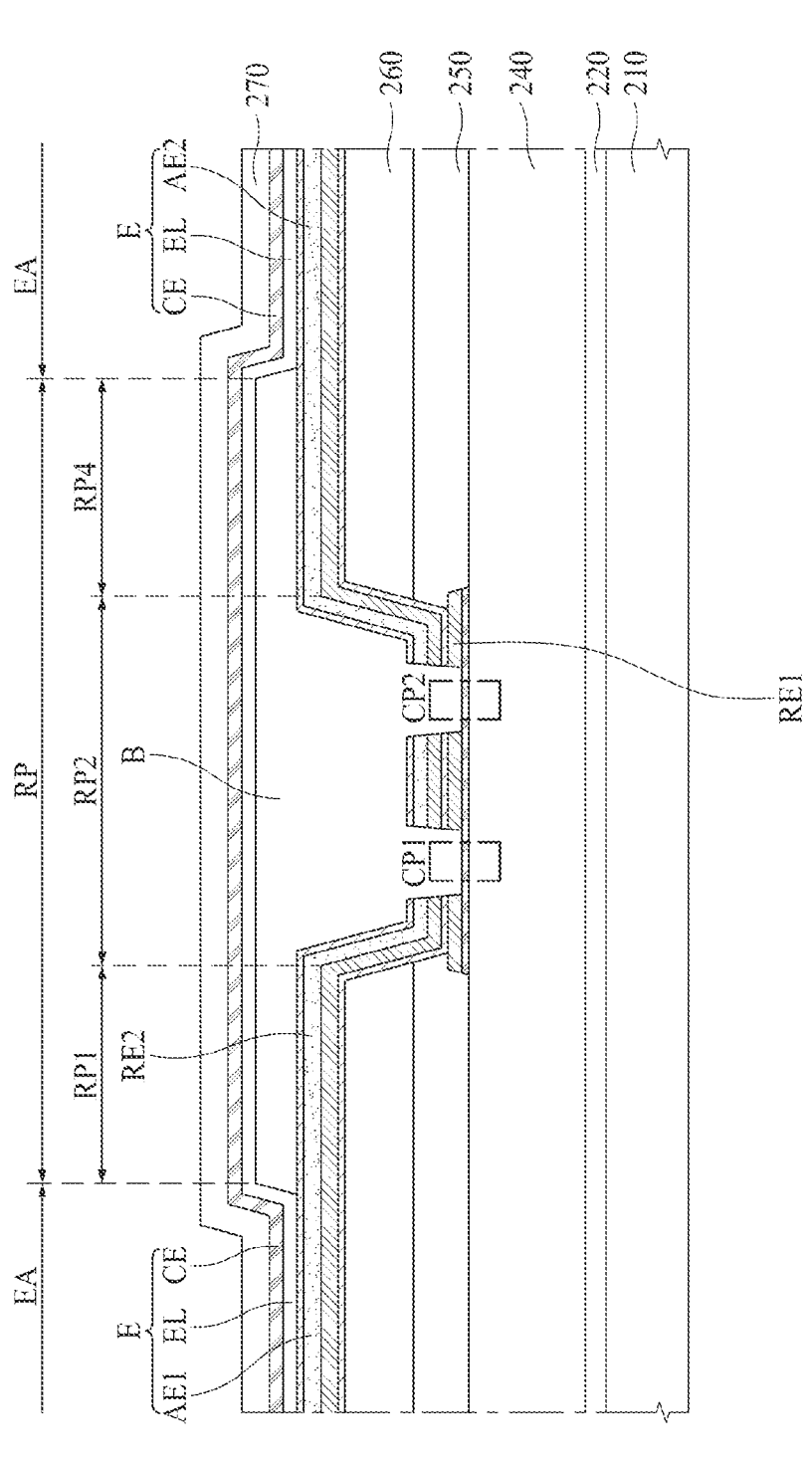
FIG. 8B is a cross sectional view along line D-D' of FIG. 7A.
Figure 8C:
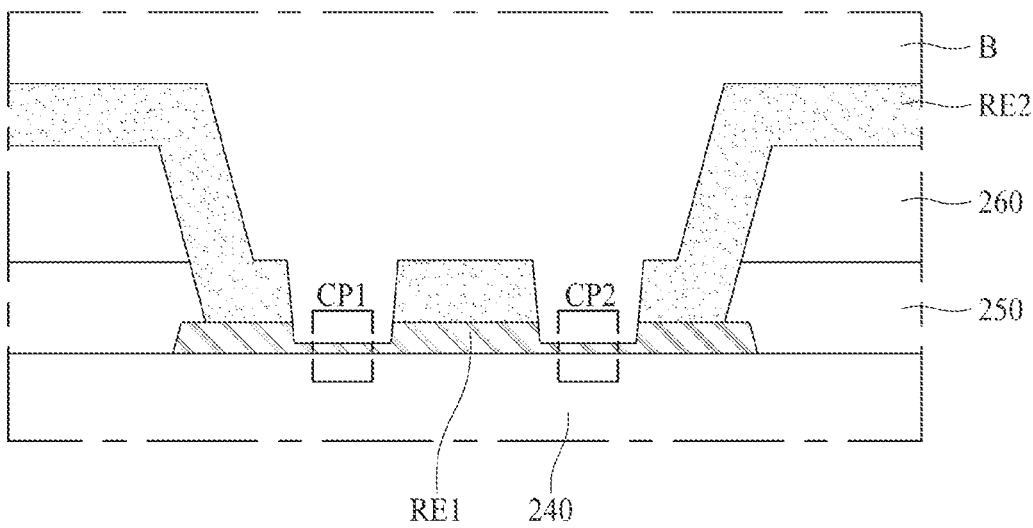
FIG. 8C is an expanded view illustrating a repair portion of FIG. 8B.

FIG. 8B is a cross sectional view along line D-D' of FIG. 7A, and FIG. 8C is an expanded view of a repair portion.

Referring to FIG. 8B, the organic light emitting display apparatus 100 according to one embodiment of the present disclosure may further include an emission area (EA) defined by a bank (B) and the anode electrode first portion (AE1) and the anode electrode second portion (AE2) of the organic light emitting diode (E), and a repair portion formed at one side of the emission area (EA). The emission area (EA) of the organic light emitting display apparatus 100 may be defined as the area which is overlapped with the anode electrode first portion (AE1), the anode electrode second portion (AE2), an emission layer (EL) and a cathode electrode (CE) included in the organic light emitting diode (E), and is divided by the bank (B).

The repair portion (RP) may be defined as the area extending from one side of the emission area (EA), wherein the repair portion (RP) may be defined as the area provided with a first repair electrode (RE1) and/or second repair electrode (RE2) for the electrical connection of the anode electrode first portion (AE1) and the anode electrode second portion (AE2) of the organic light emitting diode (E) with the driving thin film transistor (T).

Also, the repair portion (RP) may include a first repair portion (RP1) in which the second repair electrode (RE2) connected with the anode electrode first portion (AE1) is formed on a planarization layer 260; a fourth repair portion (RP4) in which the second repair electrode (RE2) connected with the anode electrode second portion (AE2) is formed on the planarization layer 260; and a second repair portion (RP2) extending from the first repair portion (RP1) and the fourth repair portion (RP4), which is provided with the first repair electrode (RE1) formed on an interlayer dielectric 240, a sidewall formed by etching at least some portions of a passivation layer 250 and the planarization layer 260, and the second repair electrode (RE2) overlapped with at least some portion of the first repair electrode (RE1).

Figure 8D:
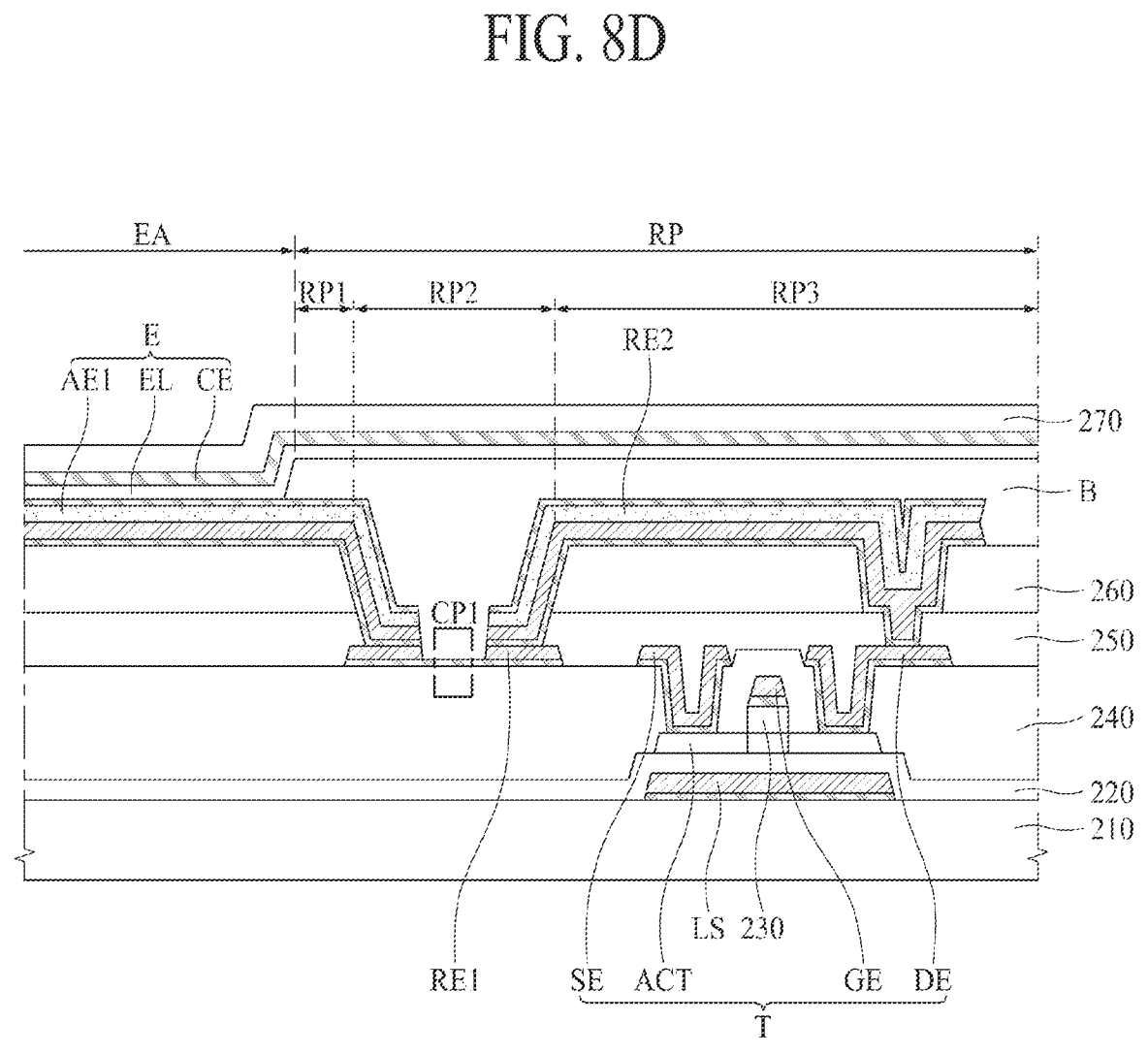
Figure 8E:
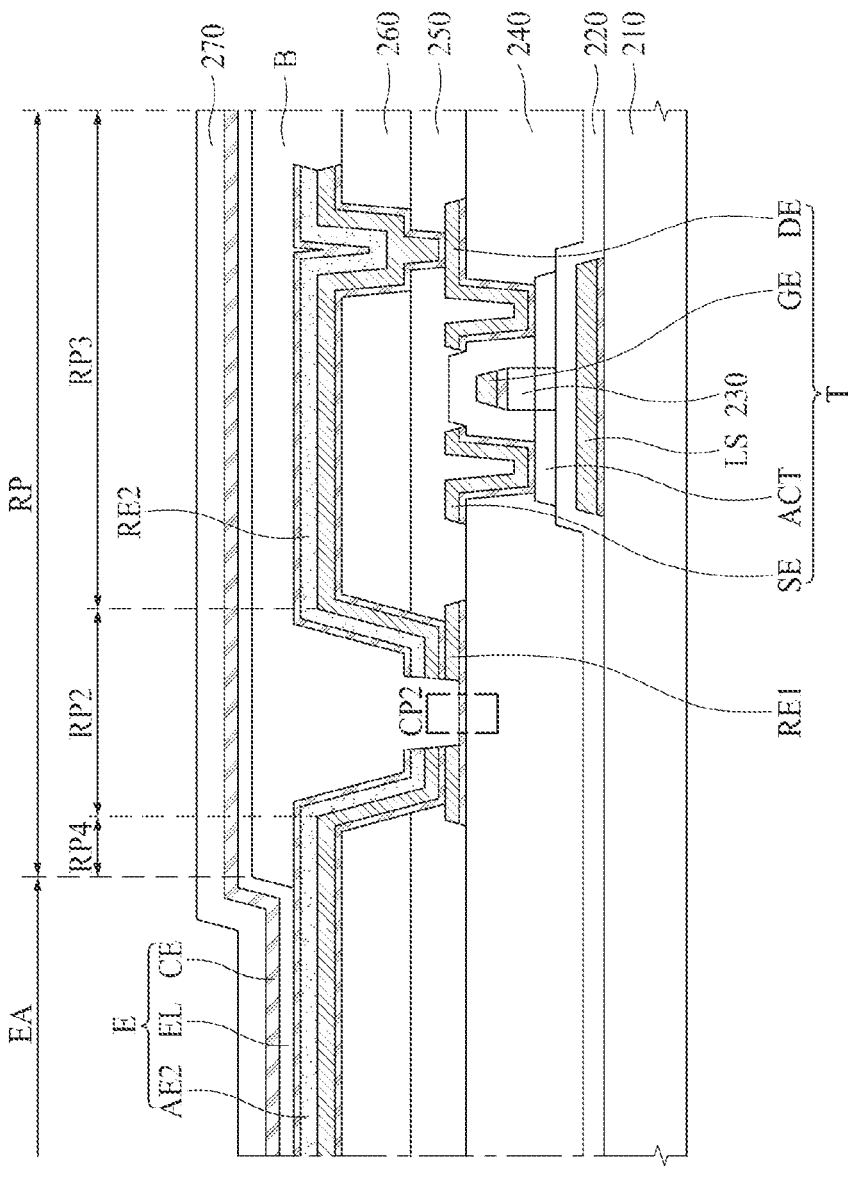
FIG. 8E is a cross sectional view of a cutting line which is cut along a second anode electrode, a repair portion and a driving thin film transistor of FIG. 7A.

Also, as shown in FIGS. 8D and 8E, the repair portion (RP) according to the present disclosure may further include a third repair portion (RP3) with the second repair electrode (RE2) which extends from the second repair portion (RP2), is formed on the planarization layer 260, and is electrically connected with the driving thin film transistor (T).

Also, the second repair portion (RP2) may further include a first cutting point (CP1) and a second cutting point (CP2) which are formed by etching at least some portions of the first repair electrode (RE1) and the second repair electrode (RE2). As described above, the first cutting point (CP1) and the second cutting point (CP2) may be formed in the second repair portion (RP2) overlapped with a current path from the driving thin film transistor (T) to the anode electrode first portion (AE1) and the anode electrode second portion (AE2).

If at least some portions of the first repair electrode (RE1) and the second repair electrode (RE2) are etched so as to form the first cutting point (CP1) and the second cutting point (CP2), the remaining thickness in each of the first repair electrode (RE1) and the second repair electrode (RE2) may be adjusted in consideration of the relative etching rate of the first repair electrode (RE1) and the second repair electrode (RE2) so that they may be easily cut by a following general repair cutting process. According to one embodiment of the present disclosure, all the second repair electrode (RE2) may be etched in the area corresponding to the first cutting point (CP1) and the second cutting point (CP2), and only the half of the first repair electrode (RE1) may be etched in the area corresponding to the first cutting point (CP1) and the second cutting point (CP2), but not limited to this structure.

As described above, the first repair electrode (RE1) may be provided on the interlayer dielectric 240, may be disposed in the same layer as the source and drain electrodes (SE, DE) in the interlayer dielectric 240, may be manufactured by the same process as that of the interlayer dielectric 240, and may be obtained by a predetermined patterning process. According to one embodiment of the present disclosure, the first repair electrode (RE1) may be formed of the same material as those of the source electrode (SE) and the drain electrode (DE). For example, the first repair electrode (RE1) may be formed in a dual-layered structure obtained by depositing aluminum (Al) and titanium (Ti), or a three-layered structure obtained by depositing titanium (Ti)/aluminum (Al)/titanium (Ti). The first repair electrode (RE1) may have a thickness of 300 nm-700 nm. As described above, the predetermined area overlapped with the area of forming the first repair electrode (RE1) may be defined as the second repair portion (RP2), and may include the plurality of cutting points (CP) comprising the first cutting point (CP1) and the second cutting point (CP2), and may be the area for the repair process of the organic light emitting display apparatus 100. At least some portion of the second repair electrode (RE2) may be formed to be overlapped with the first repair electrode (RE1) of the second repair portion (RP2), the second repair electrode (RE2) may be formed on the sidewall formed by etching at least some portions of the planarization layer 260 and the passivation layer 250 in the second repair portion (RP2), and the second repair electrode (RE2) may be formed on the planarization layer 260 of the first repair portion (RP1) and the third repair portion (RP3). The second repair electrode (RE2) may be formed in the same layer as the anode electrode first portion (AE1) and the anode electrode second portion (AE2) of the emission area (EA), may be manufactured by the same process as those of the anode electrode first portion (AE1) and the anode electrode second portion (AE2) of the emission area (EA), and may be obtained by a predetermined patterning process.

Also, as shown in FIG. 8B, the anode electrode first portion (AE1) and the anode electrode second portion (AE2) of the emission area (EA) are formed in the same layer as the second repair electrode (RE2) of the repair portion (RP). Herein, the same layer indicates not only the single layer such as the planarization layer 260 or the passivation layer 250, but also the sidewall formed by etching at least some portions of the planarization layer 260 and the interlayer dielectric 240 in the area corresponding to the second repair portion (RP2), and the outermost layer exposed to the external and configured to have the predetermined profile before the process of the second repair electrode (RE2) of the organic light emitting display apparatus 100 according to the present disclosure, for example, the first repair electrode (RE1) of the second repair portion (RP2).

Accordingly, the anode electrode first portion (AE1) and the anode electrode second portion (AE2) may be formed on the planarization layer 260, as shown in FIG. 8A. Also, as shown in FIG. 8B, the second repair electrode (RE2) may be formed on the planarization layer 260, and also may be formed on the passivation layer 250 and the first repair electrode (RE1) whose some portions are exposed by the etching process. In this case, the anode electrode first portion (AE1) and the anode electrode second portion (AE2) of the organic light emitting diode (E) may be disposed in the same layer as the second repair electrode (RE2). As shown in FIG. 8B, the first repair portion (RP1) may be formed at the side of the emission area in which the anode electrode first portion (AE1) is positioned, and the fourth repair portion (RP4) may be formed at the side of the emission area in which the anode electrode second portion (AE2) is positioned. Also, at least two cutting points may be formed in the second repair portion (RP2), for example, the first cutting point (CP1) and the second cutting point (CP2) may be formed in the second repair portion (RP2). In this case, the first cutting point (CP1) may be formed in the current path of the driving thin film transistor (T) and the anode electrode first portion (AE1) of the organic light emitting device, and the second cutting point (CP2) may be formed in the current path of the driving thin film transistor (T) and the anode electrode second portion (AE2) of the organic light emitting device.

Accordingly, as shown in FIG. 7A, if the anode electrode (AE) of the organic light emitting diode (E) may have the partition structure including the anode electrode first portion (AE1) and the anode electrode second portion (AE2), and defects such as bright spots are generated in the sub pixel branched from any one of the anode electrode first portion (AE1) and the anode electrode second portion (AE2), the repair process may be selectively carried out in any one of the first cutting point (CP1) and the second cutting point (CP2), that is, the repair process may be performed by darkening the sub pixel with the bright spots.

Referring to FIG. 8C, the first cutting point (CP1) and the second cutting point (CP2) are formed by etching at least some portions of the first repair electrode (RE1) and the second repair electrode (RE2), whereby it may provide the structure appropriate for the repair process in the sub pixel with the bright spots. FIG. 8B illustrates that each of the first repair electrode (RE1) and the second repair electrode (RE2) is formed of the plurality of layers. For convenience of explanation, FIG. 8C shows that each of the first repair electrode (RE1) and the second repair electrode (RE2) is formed in the single-layered structure. Also, both the single-layered structure and the multi-layered structure in each of the first repair electrode (RE1) and the second repair electrode (RE2) may be included in the scope of the present disclosure.

That is, the thickness of the area for the cutting point (CP1, CP2) is relatively smaller than the thickness of the remaining areas without the cutting point (CP1, CP2), whereby it facilitates the repair process. For example, if the repair process is selectively carried out for the sub pixel having the bright spot after completing the manufacturing process of the organic light emitting display apparatus 100, a laser irradiation process may be performed. As described above, the thickness of the cutting point (CP1, CP2) is relatively smaller than the thickness of the remaining areas without the cutting point (CP1, CP2), for example, the first repair electrode (RE1) and the second repair electrode (RE2) in the second repair portion (RP2), so that it is possible to perform the repair process for the cutting point (CP1, CP2) by the laser irradiation having a relatively-low energy level. Thus, it is possible to minimize or reduce damages on the organic light emitting diode (E) and the encapsulation layer 270 for the repair process, and to improve reliability of the organic light emitting display apparatus 100.

According to one embodiment of the present disclosure, all the second repair electrode (RE2) may be etched in the first cutting point (CP1) and the second cutting point (CP2) of the second repair portion (RP2), and at least some portions of the first repair electrode (RE1) may be etched in the first cutting point (CP1) and the second cutting point (CP2) of the second repair portion (RP2). Also, according to another embodiment of the present disclosure, all the second repair electrode (RE2) may be etched in the first cutting point (CP1) of the second repair portion (RP2), and the first repair electrode (RE1) may be not etched in the first cutting point (CP1) of the second repair portion (RP2).

The method of forming the first and second cutting points (CP1, CP2) and the etching process for patterning the anode electrode (AE) of the organic light emitting diode (E) may be carried out at the same time. The second repair electrode (RE2) corresponding to the first and second cutting points (CP1, CP2) of the second repair portion (RP2) may be removed by the etching process. Also, preferably, the first repair electrode (RE1) and the second repair electrode (RE2) may be formed of different electrode materials.

For example, as described above, the first repair electrode (RE1) may be formed in a single-layered structure of any one material among transparent conductive oxide (TCO) including Indium Tin Oxide (ITO) or Indium Zinc Oxide (IZO), molybdenum titanium alloy (MoTi), aluminum (Al), silver (Ag), molybdenum (Mo), Titanium (Ti) and copper (Cu), or a multi-layered structure of materials selected among transparent conductive oxide (TCO) including Indium Tin Oxide (ITO) or Indium Zinc Oxide (IZO), molybdenum titanium alloy (MoTi), aluminum (Al), silver (Ag), molybdenum (Mo), Titanium (Ti) and copper (Cu); and the second repair electrode (RE2) may be formed in a single-layered structure of any one material selected from aluminum (Al) and titanium (Ti), or a multi-layered structure of aluminum (Al) and titanium (Ti). When selecting the materials for the first repair electrode (RE1) and the second repair electrode (RE2), the first repair electrode (RE1) and the second repair electrode (RE2) are formed of materials with different levels of etch selectivity, to thereby form the cutting points (CP1, CP2). That is, if the first repair electrode (RE1) and the second repair electrode (RE2) are formed of the materials having the different properties, and the etching process is carried out by the use of etchant with high etch selectivity for the second repair electrode (RE2), the first repair electrode (RE1) may serve as one kind of etch stopper, and the remaining thickness of the first repair electrode (RE1) may be controlled by adjusting an etching process time.

FIG. 8D is a cross sectional view of a cutting line (not shown) which is cut along the anode electrode first portion, the repair portion and the driving thin film transistor of FIG. 7A. FIG. 8E is a cross sectional view of a cutting line (not shown) which is cut along the anode electrode second portion, the repair portion and the driving thin film transistor of FIG. 7A.

Except that an anode electrode (AE) is changed into an anode electrode first portion (AE1) and an anode electrode second portion (AE2), and a first cutting point (CP1) is changed into first and second cutting points (CP1, CP2), the cross sectional view of FIGS. 8D and 8E is the same as the cross sectional view of FIG. 6A.

As shown in FIG. 8D, the anode electrode first portion (AE1) of the organic light emitting diode (E) is not directly electrically connected with a driving thin film transistor (T), but may be electrically connected with the driving thin film transistor (T) through first and second repair electrodes (RE1, RE2) of a repair portion (RP). First, when an externally-provided control signal is applied to the driving thin film transistor (T) through a gate driver 130 and a data driver 140, the driving thin film transistor (T) is turned on so that a current may be supplied to a drain electrode (DE). Then, the current may be supplied to the second repair electrode (RE2) of a third repair portion (RP3) electrically connected with the drain electrode (DE) of the driving thin film transistor (T).

If all the second repair electrode (RE2) corresponding to a first cutting point (CP1) of the second repair portion (RP2) is not etched, the current may be supplied to the second repair electrode (RE2) of the third repair portion (RP3) and the second repair electrode (RE2) of the second repair portion (RP2), and also may be supplied to the anode electrode first portion (AE1) of the organic light emitting diode (E) connected with the second repair electrode (RE2).

If all the second repair electrode (RE2) corresponding to the first cutting point (CP1) of the second repair portion (RP2) is etched, the current which is supplied to the second repair electrode (RE2) of the third repair portion (RP3) may be transmitted to the second repair electrode (RE2) of the first repair portion (RP1) through the first repair electrode (RE1) and the second repair electrode (RE2) in the second repair portion (RP2) by the use of current path of the first repair electrode (RE1) electrically connected with the second repair electrode (RE2) in the second repair portion (RP2), and then may be supplied to the anode electrode first portion (AE1) of the organic light emitting diode (E) connected with the second repair electrode (RE2).

As shown in FIG. 8E, the anode electrode second portion (AE2) of the organic light emitting diode (E) is not directly electrically connected with the driving thin film transistor (T), but electrically connected with the driving thin film transistor (T) through the first repair electrode (RE1) and the second repair electrode (RE2) of the repair portion (RP). First, according as a control signal provided from the external is applied to the driving thin film transistor (T) through the gate driver 130 and the data driver 140, the driving thin film transistor (T) is turned on so that a current may be supplied to the drain electrode (DE). Then, the current may be supplied to the second repair electrode (RE2) of the third repair portion (RP3) electrically connected with the drain electrode (DE) of the driving thin film transistor (T).

If all the second repair electrode (RE2) corresponding to the second cutting point (CP2) of the second repair portion (RP2) is not etched, the current may be supplied to the second repair electrode (RE2) of the third repair portion (RP3) and the second repair electrode (RE2) of the second repair portion (RP2), and then may be supplied to the anode electrode second portion (AE2) of the organic light emitting diode (E) connected with the second repair electrode (RE2).

If all the second repair electrode (RE2) corresponding to the second cutting point (CP2) of the second repair portion (RP2) is etched, the current which is supplied to the second repair electrode (RE2) of the third repair portion (RP3) may be transmitted to the second repair electrode (RE2) of the fourth repair portion (RP4) through the first repair electrode (RE1) and the second repair electrode (RE2) in the second repair portion (RP2) by the use of current path of the first repair electrode (RE1) electrically connected with the second repair electrode (RE2) in the second repair portion (RP2), and then may be supplied to the anode electrode first portion (AE1) of the organic light emitting diode (E) connected with the second repair electrode (RE2).

The organic light emitting display apparatus according to the present disclosure may be described as follows.

According to an embodiment of the present disclosure, an organic light emitting display apparatus comprises a driving thin film transistor provided on a substrate and disposed in a pixel area including a plurality of sub pixels; an organic light emitting device electrically connected with the driving thin film transistor; and a repair portion provided at one side of the organic light emitting device, wherein the organic light emitting device is electrically connected with the driving thin film transistor through the repair portion.

According to one or more embodiments of the present disclosure, the driving thin film transistor may include an active layer; a gate electrode provided above or below the active layer; a gate insulating film disposed between the active layer and the gate electrode; a source electrode being in contact with one side of the active layer; and a drain electrode being in contact with the other side of the active layer, wherein the driving thin film transistor further includes an interlayer dielectric disposed to surround the active layer, the gate electrode and the gate insulating film, and configured to include a contact hole so as to bring the source and drain electrodes in contact with the active layer, and the drain electrode is connected with the repair portion.

According to one or more embodiments of the present disclosure, the organic light emitting device may include an anode electrode connected with the repair portion; an emission layer provided on the anode electrode; and a cathode electrode provided on the emission layer.

According to one or more embodiments of the present disclosure, the repair portion may include a first repair electrode provided on the interlayer dielectric; and a second repair electrode partially overlapped with the first repair electrode, and connected with the anode electrode.

According to one or more embodiments of the present disclosure, the repair portion may include at least one cutting point formed by etching at least some portions of the first repair electrode and the second repair electrode.

According to one or more embodiments of the present disclosure, the first repair electrode may be formed in the same layer as the source and drain electrodes.

According to one or more embodiments of the present disclosure, the second repair electrode may be formed in the same layer as the anode electrode of the organic light emitting device, and may be connected with the driving thin film transistor.

According to one or more embodiments of the present disclosure, the anode electrode may include an anode electrode first portion and an anode electrode second portion which are separated from each other and are provided horizontally within one sub pixel, wherein each of the anode electrode first portion and the anode electrode second portion may be connected with the repair portion.

According to one or more embodiments of the present disclosure, the organic light emitting display apparatus further includes a planarization layer provided on the driving thin film transistor, wherein the organic light emitting device may be provided on the planarization layer.

According to one or more embodiments of the present disclosure, the pixel area may include an emission area having the plurality of sub pixels, and a transmission area disposed adjacent to the emission area.

According to one or more embodiments of the present disclosure, the pixel area further may include a repair area protruding from at least one side of the emission area, and the repair portion may be prepared in the repair area.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display apparatus comprising:
a driving thin film transistor of one subpixel provided on a substrate and disposed in a pixel area including a plurality of sub pixels;
an organic light emitting diode of the one subpixel electrically connected with the driving thin film transistor of the one subpixel; and
a repair portion provided at one side of the organic light emitting diode,
wherein the organic light emitting diode is electrically connected with the driving thin film transistor and the repair portion,
wherein the organic light emitting diode includes an anode electrode electrically connected with the repair portion,
wherein the anode electrode includes an anode electrode first portion and an anode electrode second portion which are separated from each other, wherein the anode electrode first portion and the anode electrode second portion are connected to the repair portion,
wherein the anode electrode first portion is electrically connected to the anode electrode second portion,
wherein the substrate includes a bank covering at least a portion of each of the anode electrode first portion and the anode electrode second portion, and
wherein the organic light emitting diode further includes a cathode electrode covering the repair portion, the anode electrode first portion, the anode electrode second portion, and the bank, wherein the anode electrode first portion and the anode electrode second portion are arranged in the one subpixel,
wherein the organic light emitting diode of the one subpixel includes an emission layer that is continuously disposed directly on the anode electrode first portion and the anode electrode second portion of the one subpixel and over the driving thin film transistor of the one subpixel.

2. The organic light emitting display apparatus according to claim 1, wherein the driving thin film transistor includes:
an active layer;
a gate electrode provided above or below the active layer;
a gate insulating film disposed between the active layer and the gate electrode;
a source electrode being in contact with one side of the active layer; and
a drain electrode being in contact with another side of the active layer,
wherein the driving thin film transistor further includes an interlayer dielectric disposed to surround the active layer, the gate electrode and the gate insulating film, and configured to include a contact hole so as to bring the source and drain electrodes in contact with the active layer, and the drain electrode is connected with the repair portion.

3. The organic light emitting display apparatus according to claim 1, wherein
the emission layer is provided on the anode electrode, and
wherein the cathode electrode is provided on the emission layer.

4. The organic light emitting display apparatus according to claim 1, wherein the repair portion includes:
a first repair electrode provided on an interlayer dielectric; and
a second repair electrode at least partially overlapped with the first repair electrode, and connected with the anode electrode.

5. The organic light emitting display apparatus according to claim 1, wherein the repair portion includes at least one cutting point.

6. The organic light emitting display apparatus according to claim 4, wherein the first repair electrode and the second repair electrode are formed of different electrode materials.

7. The organic light emitting display apparatus according to claim 4, wherein the first repair electrode is formed in a same layer as source and drain electrodes of the driving thin film transistor.

8. The organic light emitting display apparatus according to claim 4, wherein the second repair electrode is formed in a same layer as the anode electrode of the organic light emitting diode, and is connected with the driving thin film transistor.

9. The organic light emitting display apparatus according to claim 1, wherein the repair portion includes a first cutting point and a second cutting point, which correspond to the anode electrode first portion and the anode electrode second portion, respectively.

10. The organic light emitting display apparatus according to claim 1, further comprising a planarization layer provided on the driving thin film transistor,
wherein the organic light emitting diode is provided on the planarization layer.

11. The organic light emitting display apparatus according to claim 1, wherein the pixel area includes an emission area having the plurality of sub pixels, and a transmission area disposed adjacent to the emission area.

12. The organic light emitting display apparatus according to claim 11, wherein the pixel area further includes a repair area protruding from at least one side of the emission area, and the repair portion is prepared in the repair area.

13. The organic light emitting display apparatus according to claim 12, wherein the repair portion is provided between the emission area and the transmission area.

14. The organic light emitting display apparatus according to claim 12, wherein the separated anode electrode first portion and the anode electrode second portion include a protruding portion horizontally toward the transmission area and connected with the repair area.

\* \* \* \* \*